United States Patent
Park

(10) Patent No.: US 11,776,617 B2
(45) Date of Patent: Oct. 3, 2023

(54) APPLICATION PROCESSORS AND ELECTRONIC DEVICES INCLUDING THE SAME

(71) Applicant: SAMSUNG ELECTRONICS CO., LTD., Suwon-si (KR)

(72) Inventor: Kyumin Park, Seoul (KR)

(73) Assignee: SAMSUNG ELECTRONICS CO., LTD.

( * ) Notice: Subject to any disclaimer, the term of this patent is extended or adjusted under 35 U.S.C. 154(b) by 142 days.

(21) Appl. No.: 17/495,690

(22) Filed: Oct. 6, 2021

(65) Prior Publication Data

US 2022/0270665 A1 Aug. 25, 2022

(30) Foreign Application Priority Data

Feb. 25, 2021 (KR) .......................... 10-2021-0025364

(51) Int. Cl.
*G06F 13/16* (2006.01)
*G11C 11/4093* (2006.01)
*G11C 11/4091* (2006.01)
*G11C 11/4072* (2006.01)

(52) U.S. Cl.
CPC ...... *G11C 11/4093* (2013.01); *G06F 13/1668* (2013.01); *G11C 11/4072* (2013.01); *G11C 11/4091* (2013.01)

(58) Field of Classification Search
None
See application file for complete search history.

(56) References Cited

U.S. PATENT DOCUMENTS

| | | | |
|---|---|---|---|
| 6,639,868 B2 | 10/2003 | Kim et al. | |
| 8,300,496 B2 | 10/2012 | Yun et al. | |
| 8,471,616 B2 | 6/2013 | Kim et al. | |
| 9,361,253 B2 | 6/2016 | Ookubo et al. | |
| 9,864,720 B2 | 1/2018 | Chae et al. | |
| 10,332,573 B2 | 6/2019 | Hong | |
| 10,366,023 B2 | 7/2019 | Kim et al. | |
| 10,628,254 B2 | 4/2020 | Lee | |
| 2020/0089630 A1 | 3/2020 | Yamamoto et al. | |
| 2020/0133505 A1 | 4/2020 | Kim | |
| 2020/0133542 A1* | 4/2020 | Kim | G06F 3/0673 |

FOREIGN PATENT DOCUMENTS

KR 936797 A 10/2009
KR 20200048607 A 5/2020

* cited by examiner

*Primary Examiner* — Scott C Sun
(74) *Attorney, Agent, or Firm* — Fish & Richardson P.C.

(57) ABSTRACT

An application processor includes a memory interface and a memory controller. The memory interface is connected to a semiconductor memory device through first data input/output (I/O) pads and second data I/O pads. The memory controller exchanges data with the semiconductor memory device by controlling the memory interface. The memory interface includes a training circuit to perform duty training of first data signals and second data signals by adjusting a duty of each of the first data signals with respect to a first reference voltage and adjusting a duty of each of the second data signals with respect to a second reference voltage.

20 Claims, 20 Drawing Sheets

| ch | p | n | dm0 | dq0 | dq1 | dq2 | dq3 | dq4 | dq5 | dq6 | dq7 | dm1 | dq8 | dq9 | dq10 | dq11 | dq12 | dq13 | dq14 | dq15 |
|---|---|---|---|---|---|---|---|---|---|---|---|---|---|---|---|---|---|---|---|---|
| ch0 | p0 | n0 | 74 | 72 | 57 | 60 | 61 | 64 | 59 | 60 | 58 | 75 | 55 | 56 | 53 | 67 | 60 | 59 | 53 | 69 |
| ch0 | p0 | n1 | 73 | 68 | 45 | 69 | 50 | 54 | 48 | 48 | 50 | 69 | 62 | 62 | 45 | 52 | 49 | 52 | 41 | 56 |
| ch0 | p0 | n2 | 67 | 64 | 40 | 69 | 45 | 49 | 42 | 44 | 43 | 66 | 65 | 63 | 39 | 48 | 42 | 46 | 37 | 51 |
| ch0 | p0 | n3 | 63 | 60 | 37 | 68 | 42 | 45 | 37 | 40 | 38 | 62 | 64 | 61 | 38 | 44 | 39 | 40 | 33 | 45 |
| ch0 | p1 | n0 | 65 | 66 | 66 | 50 | 70 | 73 | 68 | 68 | 67 | 68 | 46 | 49 | 62 | 66 | 68 | 68 | 65 | 69 |
| ch0 | p1 | n1 | 76 | 72 | 56 | 61 | 62 | 62 | 57 | 56 | 57 | 74 | 55 | 57 | 55 | 65 | 56 | 59 | 53 | 64 |
| ch0 | p1 | n2 | 76 | 73 | 53 | 64 | 58 | 59 | 51 | 54 | 53 | 75 | 62 | 61 | 52 | 60 | 54 | 54 | 47 | 60 |
| ch0 | p1 | n3 | 73 | 71 | 49 | 68 | 54 | 56 | 50 | 51 | 49 | 72 | 64 | 43 | 48 | 57 | 50 | 52 | 44 | 56 |
| ch0 | p2 | n0 | 63 | 60 | 73 | 46 | 74 | 73 | 71 | 71 | 72 | 64 | 43 | 52 | 69 | 64 | 73 | 65 | 68 | 64 |
| ch0 | p2 | n1 | 71 | 72 | 60 | 57 | 67 | 66 | 62 | 71 | 61 | 73 | 49 | 57 | 59 | 69 | 60 | 63 | 58 | 69 |
| ch0 | p2 | n2 | 75 | 72 | 58 | 61 | 62 | 63 | 56 | 67 | 55 | 76 | 55 | 57 | 55 | 67 | 57 | 58 | 52 | 63 |
| ch0 | p2 | n3 | 76 | 71 | 53 | 63 | 59 | 60 | 53 | 61 | 54 | 74 | 57 | 57 | 53 | 61 | 54 | 57 | 48 | 62 |
| ch0 | p3 | n0 | 57 | 58 | 73 | 43 | 71 | 71 | 65 | 69 | 62 | 59 | 38 | 38 | 71 | 60 | 69 | 64 | 69 | 59 |
| ch0 | p3 | n1 | 67 | 69 | 65 | 54 | 69 | 66 | 59 | 67 | 59 | 69 | 47 | 50 | 61 | 69 | 65 | 67 | 62 | 68 |
| ch0 | p3 | n2 | 74 | 72 | 60 | 58 | 65 | 61 | 57 | 61 | 56 | 73 | 51 | 53 | 57 | 63 | 59 | 63 | 55 | 67 |
| ch0 | p3 | n3 | 76 | 71 | 56 | 61 | 60 | 57 | 57 | 57 | 59 | 75 | 54 | 57 | 54 | 65 | 57 | 59 | 50 | 64 |

APPLICATION PROCESSORS AND ELECTRONIC DEVICES INCLUDING THE SAME

CROSS-REFERENCE TO RELATED APPLICATION

This application claims priority under 35 USC § 119 to Korean Patent Application No. 10-2021-0025364, filed on Feb. 25, 2021, in the Korean Intellectual Property Office (KIPO), the contents of which are herein incorporated by reference in their entirety.

BACKGROUND

1. Technical Field

Example embodiments relate generally to semiconductor integrated circuits and more particularly to application processors and electronic devices including the same.

2. Description of the Related Art

An application processor is an integrated circuit in which a plurality of components and/or a plurality of intellectual properties (IPs) of an electronic system are integrated. The application processor may communicate with a memory device outside the application processor. In recent years, as operating speeds of the application processor and/or the memory device increase, respectively, the application processor should perform a plurality of trainings on the memory device before communicating with the memory device at a high speed.

During the trainings, individual reference voltage training is not possible of each of data signals due to physical limitations.

SUMMARY

Some example embodiments provide an application processor capable of securing a margin of a memory interface to set a reference voltage commonly with respect to a plurality of data signals.

Some example embodiments provide an electronic device including an application processor capable of securing a margin of a memory interface to set a reference voltage commonly with respect to a plurality of data signals.

According to example embodiments, an application processor includes a memory interface and a memory controller. The memory interface is connected to a semiconductor memory device through first data input/output (I/O) pads and second data I/O pads. The memory controller exchanges data with the semiconductor memory device by controlling the memory interface. The memory interface includes a training circuit to perform a duty training of first data signals and second data signals, which are based on the data, by adjusting a duty of each of the first data signals with respect to a first reference voltage and adjusting a duty of each of the second data signals with respect to a second reference voltage. The first data signals are received through the first data I/O pads, and the second data signals received through the second data I/O pads.

According to example embodiments, an electronic device includes a semiconductor memory device to store data and an application processor to control the semiconductor memory device. The application processor includes a memory interface and a memory controller. The memory interface is connected to a semiconductor memory device through first data input/output (I/O) pads and second data I/O pads. The memory controller exchanges data with the semiconductor memory device by controlling the memory interface. The memory interface includes a training circuit to perform a duty training of first data signals and second data signals, which are based on the data, by adjusting a duty of each of the first data signals with respect to a first reference voltage and adjusting a duty of each of the second data signals with respect to a second reference voltage. The first data signals are received through the first data I/O pads, and the second data signals received through the second data I/O pads.

According to example embodiments, an application processor includes a memory interface, a memory controller and an on-chip memory connected to the memory interface. The memory interface is connected to a semiconductor memory device through first data input/output (I/O) pads and second data I/O pads. The memory controller exchanges data with the semiconductor memory device by controlling the memory interface. The memory interface includes a training circuit to perform a duty training of first data signals and second data signals, which are based on the data, by adjusting a duty of each of the first data signals with respect to a first reference voltage and adjusting a duty of each of the second data signals with respect to a second reference voltage. The first data signals are received through the first data I/O pads, and the second data signals are received through the second data I/O pads. The memory interface includes a data reception circuit and a data transmission circuit. The data reception circuit is connected to the first data I/O pads and the second data I/O pads and includes first receivers, each receiving a respective one of the first data signals from the semiconductor memory device, and second receivers, each receiving a respective one of the second data signals from the semiconductor memory device. The data transmission circuit is connected to the first data I/O pads and the second data I/O pads and includes first transmitters, each transmitting respective one of the first data signals to the semiconductor memory device, and second transmitters, each transmitting respective one of the second data signals to the semiconductor memory device. The training circuit calculates eye opening values of an initial value through a final value of possible combinations of the reception control code set by sweeping the possible combinations from the initial value to the final value and stores the calculated eye opening values in the on-chip memory with a table form.

Accordingly, the application processor and the electronic devices include the memory interface and the memory interface may adjust a duty of each of the data signals at a fixed level of a reference voltage and, thus, the memory interface may increase a signal margin to enhance performance.

BRIEF DESCRIPTION OF THE DRAWINGS

Illustrative, non-limiting example embodiments will be more clearly understood from the following detailed description taken in conjunction with the accompanying drawings.

FIG. 17 illustrates an example of a first table in the on-chip memory of FIG. 16 according to example embodiments.

DETAILED DESCRIPTION OF THE EMBODIMENTS

Figure 1:
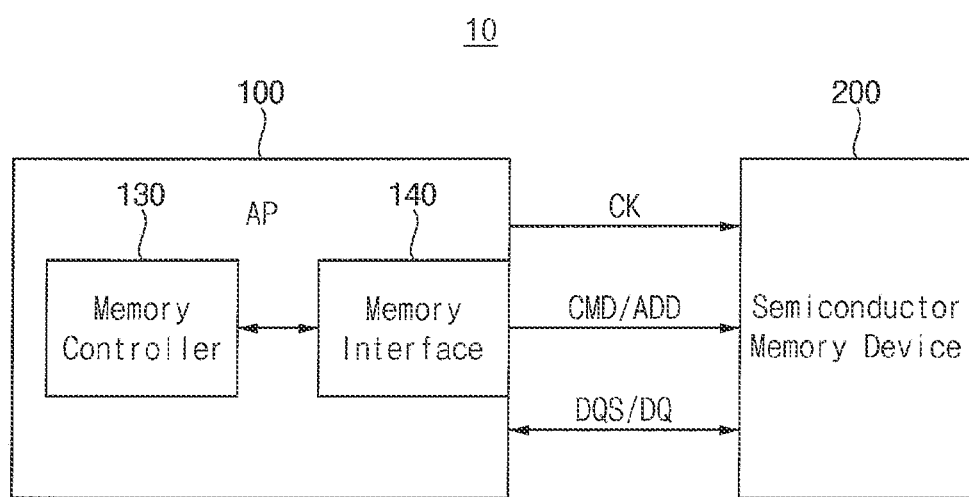
FIG. 1 is a block diagram illustrating an electronic device according to example embodiments.

Various example embodiments will be described more fully with reference to the accompanying drawings, in which embodiments are shown. The present disclosure may, however, be embodied in many different forms and should not be construed as limited to the embodiments set forth herein. Like reference numerals refer to like elements throughout this application.

FIG. 1 is a block diagram illustrating an electronic device according to example embodiments.

Referring to FIG. 1, an electronic device 10 may include an application processor (AP) 100 and a semiconductor memory device 200. The electronic device 10 may be also referred to as an "electronic system". For example, the electronic device 10 may be a desktop computer, a laptop computer, a workstation, a server, a mobile device, etc.

The AP 100 may control overall operations of the electronic device 10. The AP 100 may execute a program depending on an application which the electronic device 10 supports, may receive data associated with program execution from the semiconductor memory device 200, and/or may send a result of the program execution to the semiconductor memory device 200. The AP 100 may include various intellectual properties (IPs). For example, the AP 100 may include a memory controller 130 and a memory interface 140.

The memory controller 130 may control the semiconductor memory device 200 through the memory interface 140. The memory controller 130 may communicate with the memory interface 140 with a double data rate physical layer 'DDR PHY' interface (DPI). The memory controller 130 may generate commands and addresses for accessing the semiconductor memory device 200. The memory controller 130 may generate data to be stored in the semiconductor memory device 200. The memory controller 130 may receive data stored in the semiconductor memory device 200.

The memory interface 140 may send a clock CK, and a command and address CMD/ADD to the semiconductor memory device 200 under control of the memory controller 130.

The memory interface 140 may send a data strobe signal DQS and a data signal DQ to the semiconductor memory device 200 under control of the memory controller 130. The data strobe signal DQS may be used to sample the data signal DQ. The memory interface 140 may receive the data strobe signal DQS and the data signal DQ from the semiconductor memory device 200. Paths which are used to send the data strobe signal DQS and the data signal DQ from the memory interface 140 to the semiconductor memory device 200 and/or paths which are used to send the data strobe signal DQS and the data signal DQ from the semiconductor memory device 200 to the memory interface 140 may be identical to each other and/or may be shared.

Since the data strobe signal DQS and the data signal DQ are bi-directional signals, the data strobe signal DQS and the data signal DQ which are output from the AP 100 to the semiconductor memory device 200 may be referred to as a write data strobe signal DQS and a write data signal DQ, respectively, and the data strobe signal DQS and the data signal DQ which are output from the semiconductor memory device 200 to the AP 100 may be referred to as a read data strobe signal DQS and a read data signal DQ, respectively.

Depending on a request of the AP 100, the semiconductor memory device 200 may store data or may provide data stored therein to the AP 100.

The semiconductor memory device 200 may communicate with the AP 100 through the memory interface 140. For example, the semiconductor memory device 200 may be a dynamic random access memory (DRAM) device, a static random access memory (SRAM) device, a thyristor random access memory (TRAM) device, a NAND flash memory device, a NOR flash memory device, a resistive random access memory (RRAM) device, a ferroelectric random access memory (FRAM) device, a phase change random access memory (PRAM) device, a magnetic random access memory (MRAM) device, a solid state drive (SSD), a memory card, universal flash storage (UFS), etc. Below, a description will be given in which the semiconductor memory device 200 is a DRAM device synchronized with the clock CK output from the AP 100 (e.g., a synchronous dynamic random access memory (SDRAM) device).

For example, a plurality of APs 100 may be manufactured through any manufacturing process and/or a plurality of semiconductor memory devices 200 may be manufactured of any other manufacturing process. The plurality of APs 100 may have various operating characteristics (e.g., an operating speed, power consumption, etc.), and/or the plurality of semiconductor memory devices 200 may have various operating characteristics. One of the plurality of APs 100 and/or one of the plurality of semiconductor memory devices 200 may be mounted on or used in the electronic device 10.

The AP 100 has various operating characteristics (e.g., fast, typical, slow, etc.), and the semiconductor memory device 200 also has various operating characteristics (e.g., fast, typical, slow, etc.).

For the AP 100 and the semiconductor memory device 200 mounted on the electronic device 10 to communicate with each other, training between the AP 100 and the semiconductor memory device 200 mounted on the electronic device 10 is necessary (e.g., training of an on-the-fly manner). In addition, since the semiconductor memory device 200 operates based on the clock CK transmitted from the AP 100, training of a duty cycle (or a duty ratio) of the clock CK is necessary. For example, an ideal value of the duty cycle of the clock CK may be 50% (e.g., a duration corresponding to logic "1" of the clock CK may be identical to a duration corresponding to logic "0" of the clock CK).

Figure 2:
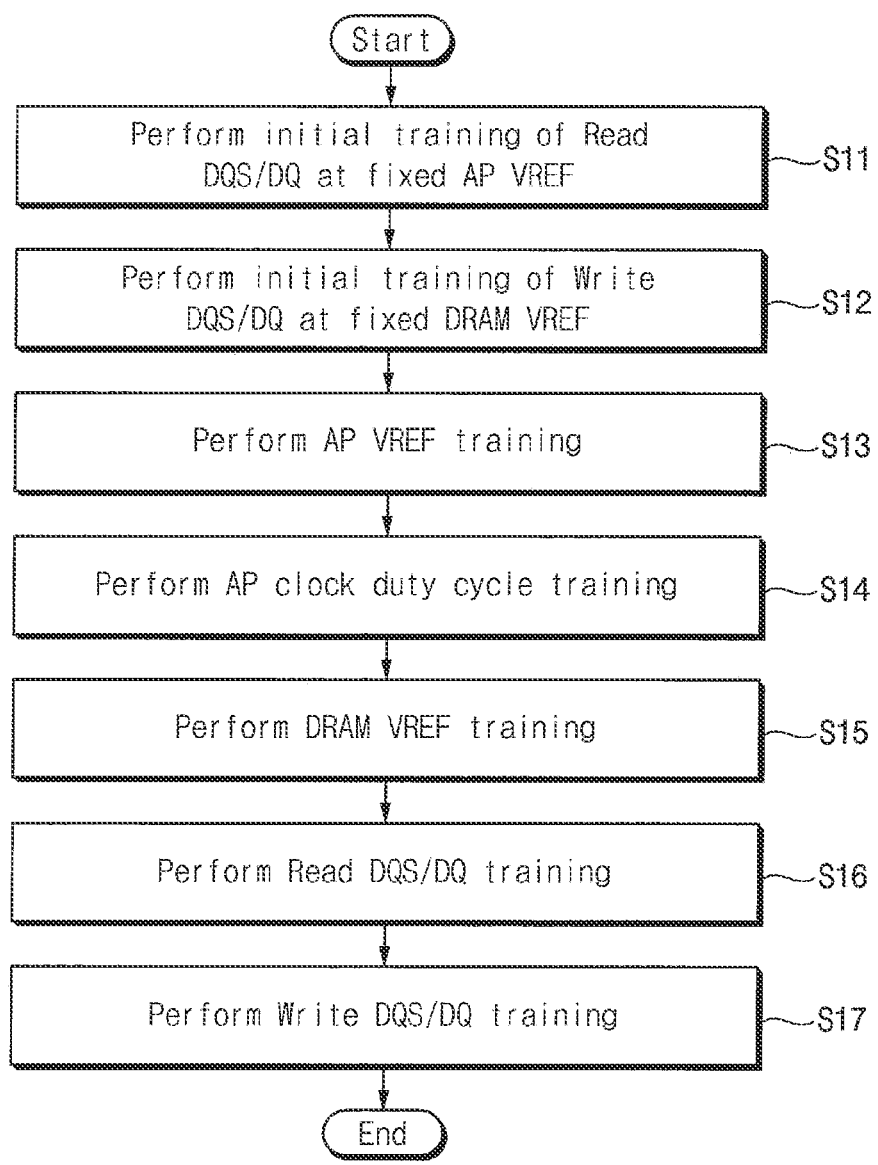
FIG. 2 illustrates a flow chart illustrating training between an AP and a semiconductor memory device in FIG. 1.

FIG. 2 illustrates a flow chart of training between an AP and a semiconductor memory device in FIG. 1.

For example, the training between the AP100 and the semiconductor memory device 200 may include a training of a skew between the read data strobe signal DQS and the read data signal DQ, a training of a level of a reference voltage VREF of the AP 100 used to determine the read data signal DQ, a training of a duty cycle of the clock CK, a training of a skew between a write data strobe signals DQS and a write data signal DQ, and/or a training of a level of a reference voltage VREF of the semiconductor memory device 200 used to determine the write data signal DQ. The trainings may be defined in the joint electron device engineering council (JEDEC) standard. However, an order of performing the trainings, a way to perform the trainings, etc. are not defined in the JEDEC standard. The individual trainings may be performed according to any of widely known methods for performing the individual trainings.

In operation S11, the AP 100 may perform an initial training of the read data strobe signal DQS/the read data signal DQ at a fixed level of the reference voltage VREF of the AP 100. The training of the read data strobe signal DQS/the read data signal DQ means a training of a skew between the read data strobe signal DQS and the read data signal DQ.

In operation S12, the AP 100 may perform an initial training of the write data strobe signal DQS/the write DQ at a fixed level of the reference voltage VREF of the semiconductor memory device 200. The training of the write data strobe signal DQS/the write data signal DQ means a training of a skew between the write data strobe signal DQS and the write data signal DQ.

In operation S13, the AP 100 may perform a training of the reference voltage VREF of the AP 100. In operation S14, the AP 100 may perform a training of a duty cycle of the clock CK.

When operation S13 and operation S14 are completed, trainings of the AP 100 for reading data stored in the semiconductor memory device 200 may be completed. In operation S15, the AP 100 may perform a training of a level of the reference voltage VREF of the semiconductor memory device 200. When operation S15 is completed, a training of the AP100 for writing data to the semiconductor memory device 200 may be completed.

In operation S16, the AP 100 may again perform the training of the read data strobe signal DQS/the read data signal DQ at a level of the reference voltage VREF of the AP 100 adjusted in operation S13.

In operation S17, the SoC 100 may again perform the training of the write data strobe signal DQS/the write data signal DQ at a level of the reference voltage VREF of the semiconductor memory device 200 adjusted in operation S15.

Referring to FIG. 2, since the fixed level of the reference voltage VREF of the AP 100 in operation S11 and the fixed level of the reference voltage VREF of the semiconductor memory device 200 in operation S12 may not be preferred or optimum, the skew between the read data strobe signal DQS and the read data signal DQ aligned in operation S11 and the skew between the write data strobe signal DQS and the write data signal DQ aligned in operation S12 may not be preferred or optimum.

Since the skew between the read data strobe signal DQS and the read data signal DQ aligned in operation S11 and/or the duty cycle of the clock CK in operation S11 may not be preferred or optimum, the level of the reference voltage VREF of the AP 100 adjusted in operation S13 may not be preferred or optimum.

Since the skew between the read data strobe signal DQS and the read data signal DQ aligned in operation S11 and/or the level of the reference voltage VREF of the AP 100 adjusted in operation S13 may not be preferred or optimum, the duty cycle of the clock CK adjusted in operation S14 may not be preferred or optimum.

Since the skew between the write DQS and the write DQ aligned in operation S12 and/or the duty cycle of the clock CK adjusted in operation S14 may not be preferred or optimum, the level of the reference voltage VREF of the memory device 200 adjusted in operation S15 may not be preferred or optimum. In the case where the AP 100 performs a plurality of trainings in any order as illustrated in FIG. 2, the trainings may have an influence on each other, and thus, a result of the trainings may not be preferred or optimum. In particular, even though an order of trainings which are performed by the AP 100 is adjusted, a result of the trainings may not still be preferred or optimum.

The AP 100 according to example embodiments may adjust the duty cycle of the clock CK of the AP 100, the level of the reference voltage VREF of the AP 100, and the skew between the read data strobe signal DQS and the read data signal DQ at the same time.

The AP 100 may adjust the level of the reference voltage VREF of the semiconductor memory device 200 and the skew between the write data strobe signal DQS and the write data signal DQ at the same time.

Accordingly, even though an operating characteristic(s) of the AP 100 mounted on the electronic device 10 and an operating characteristic(s) of the semiconductor memory device 200 mounted on the electronic device 10 are different from each other, the AP 100 may set the duty cycle of the clock CK, the level of the reference voltage VREF of the AP 100, the level of the reference voltage VREF of the semiconductor memory device 200, the skew between the read data strobe signal DQS and the read data signal DQ, and/or the skew between the write data strobe signal DQS and the write data signal DQ to improved or optimum values.

Figure 3:
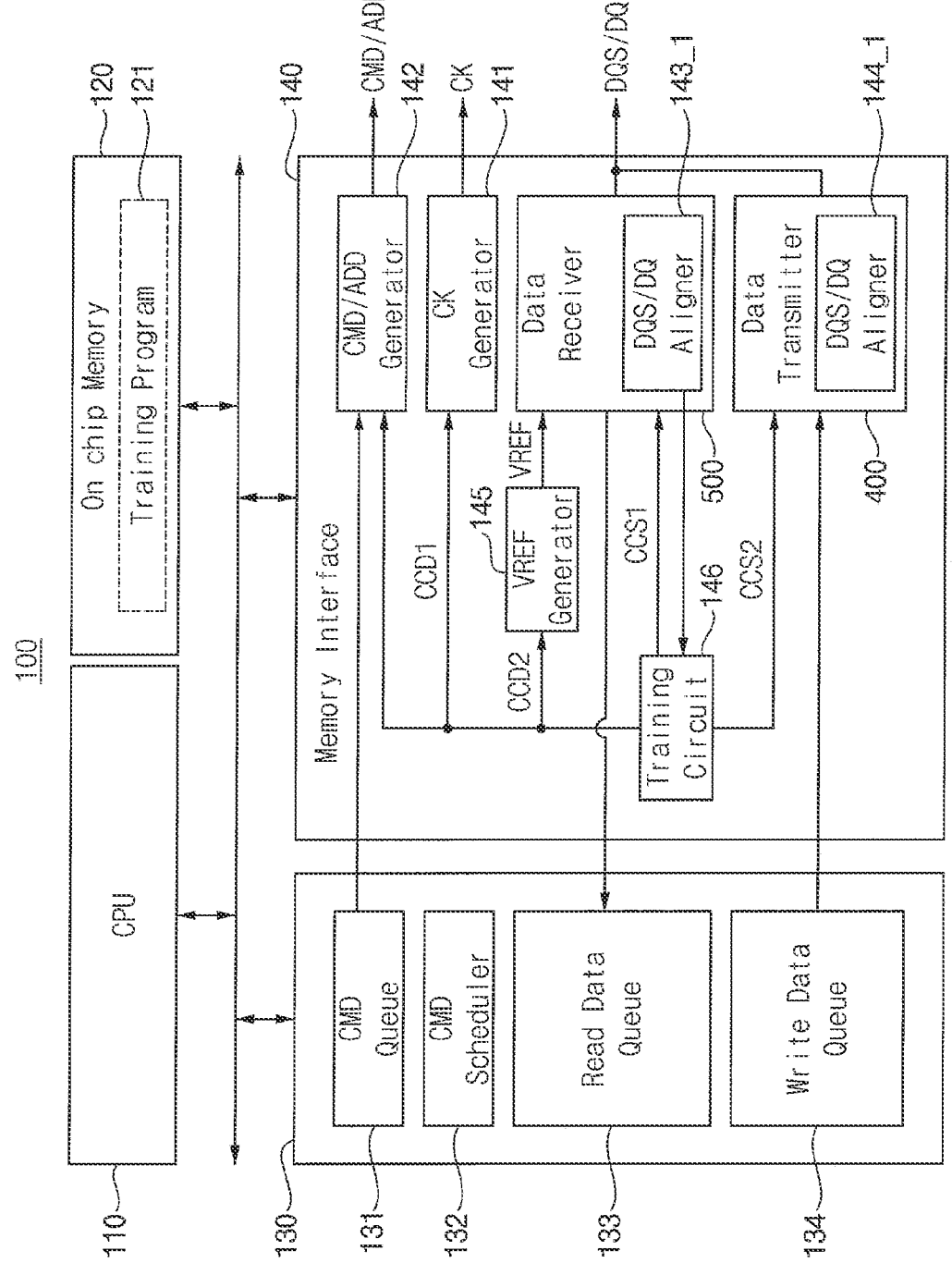
FIG. 3 is a block diagram illustrating an AP in FIG. 1 according to example embodiments.

FIG. 3 is a block diagram illustrating an AP in FIG. 1 according to example embodiments.

Referring to FIG. 3, the AP 100 may further include a central processing unit (CPU) 110 and/or an on-chip memory 120 in addition to the memory controller 130 and the memory interface 140. The CPU 110 may be referred to as a processor.

The processor 110 may execute various software (e.g., an application program, an operating system, a file system, and/or a device driver) loaded onto the on-chip memory 120.

Referring to FIG. 3, the processor 110 may execute a training program loaded onto the on-chip memory 120. The processor 110 may include homogeneous multi-core processors and/or heterogeneous multi-core processors. For example, the processor 110 may include at least one of an image signal processing unit (ISP), a digital signal processing unit (DSP), a graphics processing unit (GPU), a vision processing unit (VPU), and/or a neural processing unit (NPU).

An application program, an operating system, a file system, a device driver, etc. for driving the electronic device 10 may be loaded onto the on-chip memory 120. In particular, referring to FIG. 3, the training program 121 may be loaded onto the on-chip memory 120. For example, the on-chip memory 120 may be a cache, registers, a tightly coupled memory (TCM), an SRAM device, etc. The on-chip memory 120 may be implemented within the AP 100 and may have a faster data input/output speed than the semiconductor memory device 200. The on-chip memory 120 may be referred to as a 'buffer memory'.

The memory controller 130 may access the semiconductor memory device 200 in a direct memory access (DMA) manner. The memory controller 130 may include a command queue 131, a command scheduler 132, a read data queue 133, and/or a write data queue 134.

The read data queue 133 may store read data sent from the semiconductor memory device 200 through the memory interface 140 depending on a read request of the AP 100 for the semiconductor memory device 200. The read data stored in the read data queue 133 may be provided to the on-chip memory 120 and may be processed by the processor 110.

The write data queue 134 may store write data to be stored to the semiconductor memory device 200. Write data stored in the write data queue 134 depending on a write request of the AP 100 for the semiconductor memory device 200 may be sent to the semiconductor memory device 200 through the memory interface 140. For example, the command queue 131, the command scheduler 132, the read data queue 133, and/or the write data queue 134 of the memory controller 130 may be implemented within the AP 100 in the form of hardware or software or in the form of a combination of hardware and software.

The memory interface 140 may include a clock generator 141, a command and address generator 142, a data reception circuit 500, a data transmission circuit 400, a reference voltage generator 145, and/or a training circuit 146. The clock generator 141, the command and address generator 142, the data reception circuit 500, the data transmission circuit 400, the reference voltage generator 145, and/or the training circuit 146 of the memory interface 140 may be implemented within the AP 100 in the form of hardware (e.g., a logic circuit) or software or in the form of a combination of hardware and software.

The clock generator 141 may generate the clock CK which is output to the semiconductor memory device 200.

The clock generator 141 may adjust a duty cycle of the clock CK depending on a first code CCD1. Unlike illustration of FIG. 3, the clock generator 141 may generate differential clocks and may transmit the differential clocks to the semiconductor memory device 200.

The command and address generator 142 may receive a command or address from the command queue 131 and may transmit the command CMD or the address ADD to the semiconductor memory device 200. For example, the number of command and address transmission paths between the command and address generator 142 and the semiconductor memory device 200, logical states of signals to be sent through the above-described transmission paths based on a command or an address, a way to send, etc. may be defined in the JEDEC standard of the semiconductor memory device 200.

The data reception circuit 500 may receive read data (or, read data signals) from the semiconductor memory device 200. The data reception circuit 500 may provide the received read data to the read data queue 133.

The data reception circuit 500 may include a read data strobe signal/read data signal aligner (DQS/DQ aligner) 143_1 which aligns the read data strobe signal DQS and the read data signal DQ and/or adjusts a skew between the read data strobe signal DQS and the read data signal DQ.

The read DQS/DQ aligner 143_1 may include a delay locked loop (DLL) which includes a plurality of delay cells. For example, the read DQS/DQ aligner 143_1 may find an improved or optimum sampling point for determining the read data signal DQ at the AP 100 while delaying the read data strobe signal DQS or the read data signal DQ based on a time unit corresponding to a delay time of one delay cell.

Although not illustrated, the data reception circuit 500 may include a plurality of receivers. Each of the receivers may indirectly adjust a level of the reference voltage VREF by adjusting a duty of the read data signal DQ based on a reception control code set CCS1.

The data transmission circuit 400 may receive write data from the write data queue 134. The data transmission circuit 400 may transmit the received write data to the semiconductor memory device 200.

The data transmission circuit 400 may include a write data strobe signal/write data aligner (DQS/DQ aligner) 144_1 which aligns the write data strobe signal DQS and the write data signal DQ and/or adjusts a skew between the write data strobe signal DQS and the write data signal DQ. The write DQS/DQ aligner 144_1 may also include a DLL which includes a plurality of delay cells. The write DQS/DQ aligner 144_1 may find an improved or optimum sampling point for determining the write data signal DQ at the semiconductor memory device 200 while delaying the write data strobe signal DQS or the write data signal DQ based on a time unit corresponding to a delay time of one delay cell.

Although not illustrated, the data transmission circuit 400 may include a plurality of transmitters. Each of the transmitters may indirectly adjust a level of a reference voltage by adjusting a duty of the write data signal DQ based on a transmission control code set CCS2.

The reference voltage generator 145 may generate the reference voltage VREF and may provide the reference voltage VREF to the data reception circuit 500. The reference voltage generator 145 may adjust a level of the reference voltage VREF depending on a second code CCD2.

The training circuit 146 may operate under control of the training program 121 which is executed by the processor 110 and is stored in the on-chip memory 120. The training circuit 146 may receive the aligned read data strobe signal DQS and the aligned read data signal DQ from the read DQS/DQ aligner 143_1 of the data reception circuit 500 and may calculate a valid window margin.

In addition, the training circuit 146 may calculate (measure) eye opening values of an initial value through a final value of possible combinations of the reception control code set CCS1 and may store the possible combinations of the reception control code set CCS1 and corresponding calculated eye opening values in the on-chip memory 120 with a table form.

In addition, the training circuit 146 may calculate eye opening values of an initial value through a final value of possible combinations of the transmission control code set CCS2 and may store the possible combinations of the transmission control code set CCS2 and corresponding calculated eye opening values in the on-chip memory 120 with a table form.

The training circuit 146 may adjust, change, and/or calibrate the first code CCD1 and/or the second code CCD2 under control of the training program 121. In addition, the training circuit 146 may adjust, change, and/or calibrate the reception control code set CCS1 and/or the transmission control code set CCS2 under control of the training program 121.

The training circuit 146 may control the command and address generator 142 under control of the training program 121. For example, the command and address generator 142 may generate a read command, a write command, test data, etc. for training, depending on a test pattern of the training program 121, which may be determined in advance, and may transmit the read command, the write command, the test data, etc. to the semiconductor memory device 200.

Figure 4:
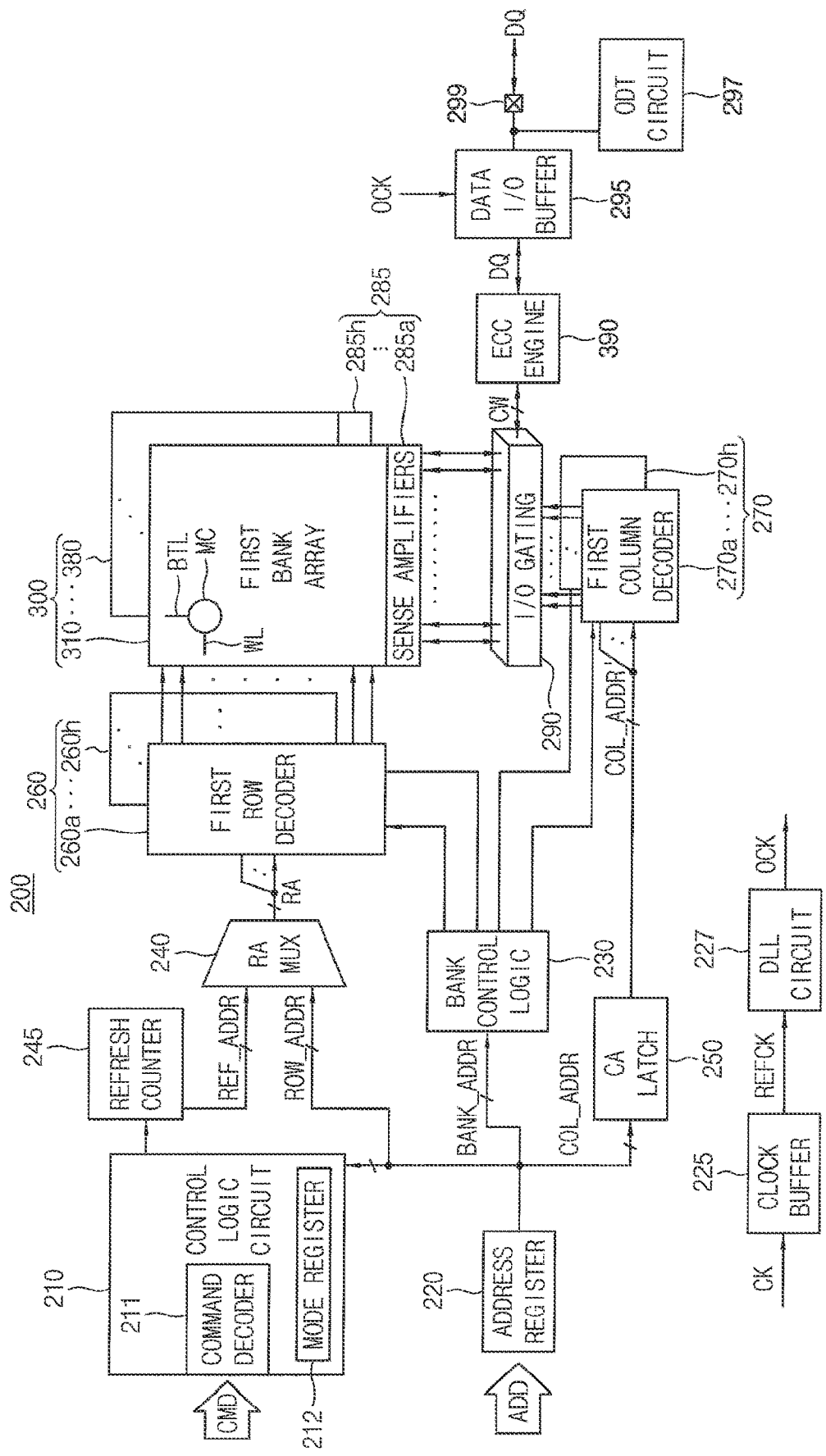
FIG. 4 is a block diagram illustrating an example of the semiconductor memory device in the electronic device of FIG. 1 according to example embodiments.

FIG. 4 is a block diagram illustrating an example of the semiconductor memory device in the electronic device of FIG. 1 according to example embodiments.

Referring to FIG. 4, the semiconductor memory device 200 may include a control logic circuit 210, an address register 220, a bank control logic 230, a refresh counter 245, a row address multiplexer 240, a column address latch 250, a row decoder 260, a column decoder 270, a memory cell array 300, a sense amplifier unit 285, an I/O gating circuit 290, an error correction code (ECC) engine 390, an on-die termination (ODT) circuit 297, a data I/O buffer 295, a clock buffer 225 and a DLL circuit 227.

For example, the semiconductor memory device 200 may be a volatile memory device and may include a DRAM device.

The memory cell array 300 may include first through eighth bank arrays 310~380. The row decoder 260 may include first through eighth row decoders 260a~260h respectively coupled to the first through eighth bank arrays 310~380, the column decoder 270 may include first through eighth column decoders 270a~270h respectively coupled to the first through eighth bank arrays 310~380, and the sense amplifier unit 285 may include first through eighth bank sense amplifiers 285a~285h respectively coupled to the first through eighth bank arrays 310~380.

The first through eighth bank arrays 310~380, the first through eighth row decoders 260a~260h, the first through eighth column decoders 270a~270h, and first through eighth bank sense amplifiers 285a~285h may form first through eighth banks. Each of the first through eighth bank arrays 310~380 may include a plurality of memory cells MC formed at intersections of a plurality of word-lines WL and a plurality of bit-line BTL.

The address register 220 may receive the address ADD including a bank address BANK_ADDR, a row address ROW_ADDR, and a column address COL_ADDR from the memory interface 140. The address register 220 may provide the received bank address BANK_ADDR to the bank control logic 230, may provide the received row address ROW_ADDR to the row address multiplexer 240, and may provide the received column address COL_ADDR to the column address latch 250.

The bank control logic 230 may generate bank control signals in response to the bank address BANK_ADDR. One of the first through eighth row decoders 260a~260h corresponding to the bank address BANK_ADDR is activated in response to the bank control signals, and one of the first through eighth column decoders 270a~270h corresponding to the bank address BANK_ADDR is activated in response to the bank control signals.

The row address multiplexer 240 may receive the row address ROW_ADDR from the address register 220 and may receive a refresh row address REF_ADDR from the refresh counter 245. The row address multiplexer 240 may selectively output the row address ROW_ADDR or the refresh row address REF_ADDR as a row address RA. The row address RA that is output from the row address multiplexer 240 may be applied to the first through eighth row decoders 260a~260h.

The refresh counter 245 may sequentially increase or decrease the refresh row address REF_ADDR under control of the control logic circuit 210.

The activated one of the first through eighth row decoders 260a~260h, by the bank control logic 230, may decode the row address RA that is output from the row address multiplexer 240 and may activate a word-line corresponding to the row address RA. For example, the activated bank row decoder may apply a word-line driving voltage to the word-line corresponding to the row address.

The column address latch 250 may receive the column address COL_ADDR from the address register 220 and may temporarily store the received column address COL_ADDR. In some embodiments, in a burst mode, the column address latch 250 may generate column addresses COL_ADDR' that increment from the received column address COL_ADDR. The column address latch 250 may apply the temporarily stored or generated column address COL_ADDR' to the first through eighth column decoders 270a~270h.

The activated one of the first through eighth column decoders 270a~270h may activate a sense amplifier corresponding to the bank address BANK_ADDR and the column address COL_ADDR through the I/O gating circuit 290.

The I/O gating circuit 290 may include circuitry for gating input/output data and may further include input data mask logic, read data latches for storing data that is output from the first through eighth bank arrays 310~380, and write drivers for writing data to the first through eighth bank arrays 310~380.

A codeword CW read from one bank array of the first through eighth bank arrays 310~380 may be sensed by a sense amplifier coupled to the one bank array from which the data is to be read and may be stored in the read data latches. The codeword CW stored in the read data latches may be provided to the AP 100 via the data I/O buffer 295 after ECC decoding is performed on the codeword CW by the ECC engine 390.

The data DQ to be written in one bank array of the first through eighth bank arrays 310~380 may be provided to the data I/O buffer 295 from the AP 100 and may be provided to the ECC engine 390 from the data I/O buffer 295. The ECC engine 390 may perform an ECC encoding on the data DQ to generate parity bits, the ECC engine 390 may provide the data DQ and the parity bits to the I/O gating circuit 290, and the I/O gating circuit 290 may write the data DQ and the parity bits in a sub-page in one bank array through the write drivers.

The data I/O buffer 295 may provide data DTA to the ECC engine 390 in a write operation of the semiconductor memory device 200, may receive the data DTA from the ECC engine 390 to and may provide the data signal DQ based on the data DTA to the AP 100 in a read operation of the semiconductor memory device 200. The data I/O buffer 295 may output the data signal DQ to the AP 100 based on an output clock (signal) OCK in the read operation.

The ECC engine 390 may perform an ECC encoding and an ECC decoding on the data DTA according to a control of the control logic circuit 210.

The clock buffer 225 may receive the clock CK and may output a reference clock signal REFCK.

The DLL circuit 227 may receive the reference clock signal REFCK and may split a phase of the reference clock signal REFCK to generate a first reference clock signal and a second reference clock signal. The DLL circuit 227 may delay the first reference clock signal and the second reference clock signal to generate a first delayed clock signal and a second delayed clock signal having a delay amount corresponding to a delay amount of one logic gate. The DLL circuit 227 may adjust finely the delay of the first delayed clock signal and the second delayed clock signal to generate the output clock signal OCK and may provide the output clock signal OCK to the data I/O buffer 295.

The control logic circuit 210 may control operations of the semiconductor memory device 200. For example, the control logic circuit 210 may generate control signals for the semiconductor memory device 200 so as to perform a write operation or a read operation. The control logic circuit 210 may include a command decoder 211 that decodes the command CMD received from the AP 100 and a mode register 212 that sets an operation mode of the semiconductor memory device 200.

For example, the command decoder 211 may generate the control signals corresponding to the command CMD by decoding a write enable signal, a row address strobe signal, a column address strobe signal, a chip select signal, etc.

The ODT circuit 297 may be connected to a data I/O pad 299 and the data I/O buffer 295. When the ODT circuit 297 is enabled, the ODT circuit 297 may perform an ODT operation. When the ODT operation is performed, signal integrity of transmitted/received signal may be enhanced by preventing signal reflection due to impedance mismatching.

Figure 5:
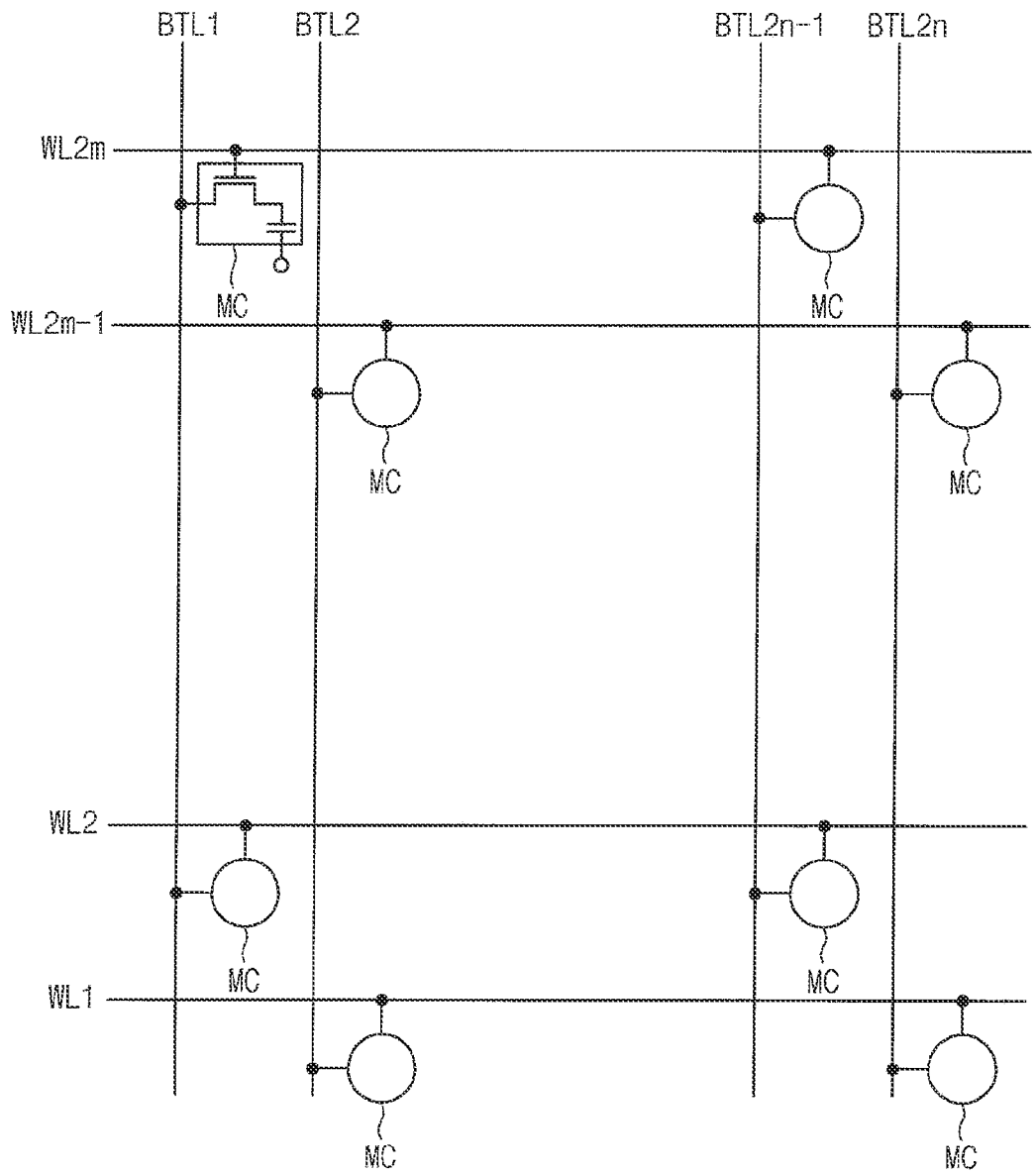
FIG. 5 illustrates an example of the first bank array in the semiconductor memory device of FIG. 4.

FIG. 5 illustrates an example of the first bank array in the semiconductor memory device of FIG. 4.

Referring to FIG. 5, the first bank array 310 includes a plurality of word-lines WL1~WL2m (m is a natural number greater than two), a plurality of bit-lines BTL1~BTL2n (n is a natural number greater than two), and a plurality of memory cells MCs disposed at intersections between the word-lines WL1~WL2m and the bit-lines BTL1~BTL2n. Each of the memory cells MCs includes a cell transistor coupled to each of the word-lines WL1~WL2m and each of the bit-lines BTL1~BTL2n and a cell capacitor coupled to the cell transistor.

The word-lines WL1~WL2m coupled to the plurality of memory cells MCs may be referred to as rows of the first bank array 310 and the bit-lines BTL1~BTL2n coupled to the plurality of memory cells MCs may be referred to as columns of the first bank array 310.

Figure 6:
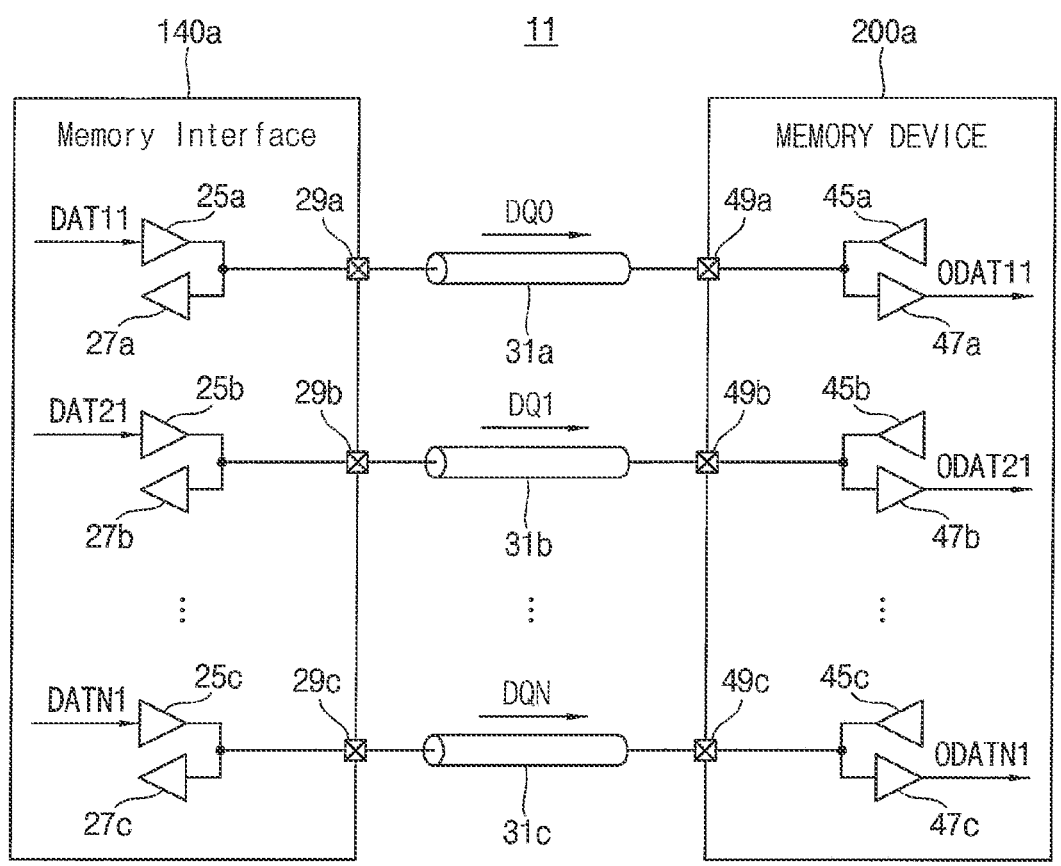
FIG. 6 is a block diagram illustrating an example of an electronic device of FIG. 1 according to example embodiments.

FIG. 6 is a block diagram illustrating an example of an electronic device of FIG. 1 according to example embodiments.

Referring to FIG. 6, an electronic device 11 may include a memory interface 140a, a semiconductor memory device 200a and a plurality of channels 31a, 31b and 31c.

The memory interface 140a may include a plurality of transmitters 25a, 25b and 25c, a plurality of receivers 27a, 27b and 27c, and a plurality of data I/O pads 29a, 29b and 29c. The semiconductor memory device 200a may include a plurality of transmitters 45a, 45b and 45c, a plurality of receivers 47a, 47b and 47c, and a plurality of data I/O pads 49a, 49b and 49c.

Each of the plurality of transmitters 25a, 25b, 25c, 45a, 45b and 45c may generate a data signal. Each of the plurality of receivers 27a, 27b, 27c, 47a, 47b and 47c may receive corresponding one of data signals DQ0, DQ1 and DQN. The plurality of transmitters 25a, 25b, 25c, 45a, 45b and 45c and the plurality of receivers 27a, 27b, 27c, 47a, 47b and 47c may transmit and receive the data signals DQ0, DQ1 and DQN through the plurality of channels 31a, 31b and 31c.

Each of the plurality of data I/O pads 29a, 29b, 29c, 49a, 49b and 49c may be connected to a respective one of the plurality of transmitters 25a, 25b, 25c, 45a, 45b and 45c and a respective one of the plurality of receivers 27a, 27b, 27c, 47a, 47b and 47c.

The plurality of channels 31a, 31b and 31c may connect the memory interface 140a with the semiconductor memory device 200a. Each of the plurality of channels 31a, 31b and 31c may be connected to a respective one of the plurality of transmitters 25a, 25b and 25c and a respective one of the plurality of receivers 27a, 27b and 27c through a respective one of the plurality of data I/O pads 29a, 29b and 29c. In addition, each of the plurality of channels 31a, 31b and 31c may be connected to a respective one of the plurality of transmitters 45a, 45b and 45c and a respective one of the plurality of receivers 47a, 47b and 47c through a respective one of the plurality of data I/O pads 49a, 49b and 49c.

FIG. 6 illustrates an operation of transferring data from the memory interface 140a to the semiconductor memory device 200a. For example, the transmitter 25a may generate a data signal DQ0 based on input data DAT11, the data signal DQ0 may be transmitted from the memory interface 140a to the semiconductor memory device 41 through the channel 31a, and the receiver 47a may receive the data signal DQ0 to obtain data ODAT11 corresponding to the data DAT11.

Similarly, the transmitter 25b may generate a data signal DQ1 based on input data DAT21, the data signal DQ1 may be transmitted to the semiconductor memory device 201 through the channel 31b, and the receiver 47b may receive the data signal DQ1 to obtain data ODAT21 corresponding to the input data DAT21. The transmitter 25c may generate a data signal DQN based on input data DATN1, the data signal DQN may be transmitted to the semiconductor memory device 201 through the channel 31c, and the receiver 47c may receive the data signal DQN to obtain data ODATN1 corresponding to the input data DATN1. For example, the input data DAT11, DAT21 and DATN1 may be write data to be written into the semiconductor memory device 201.

Figure 7:
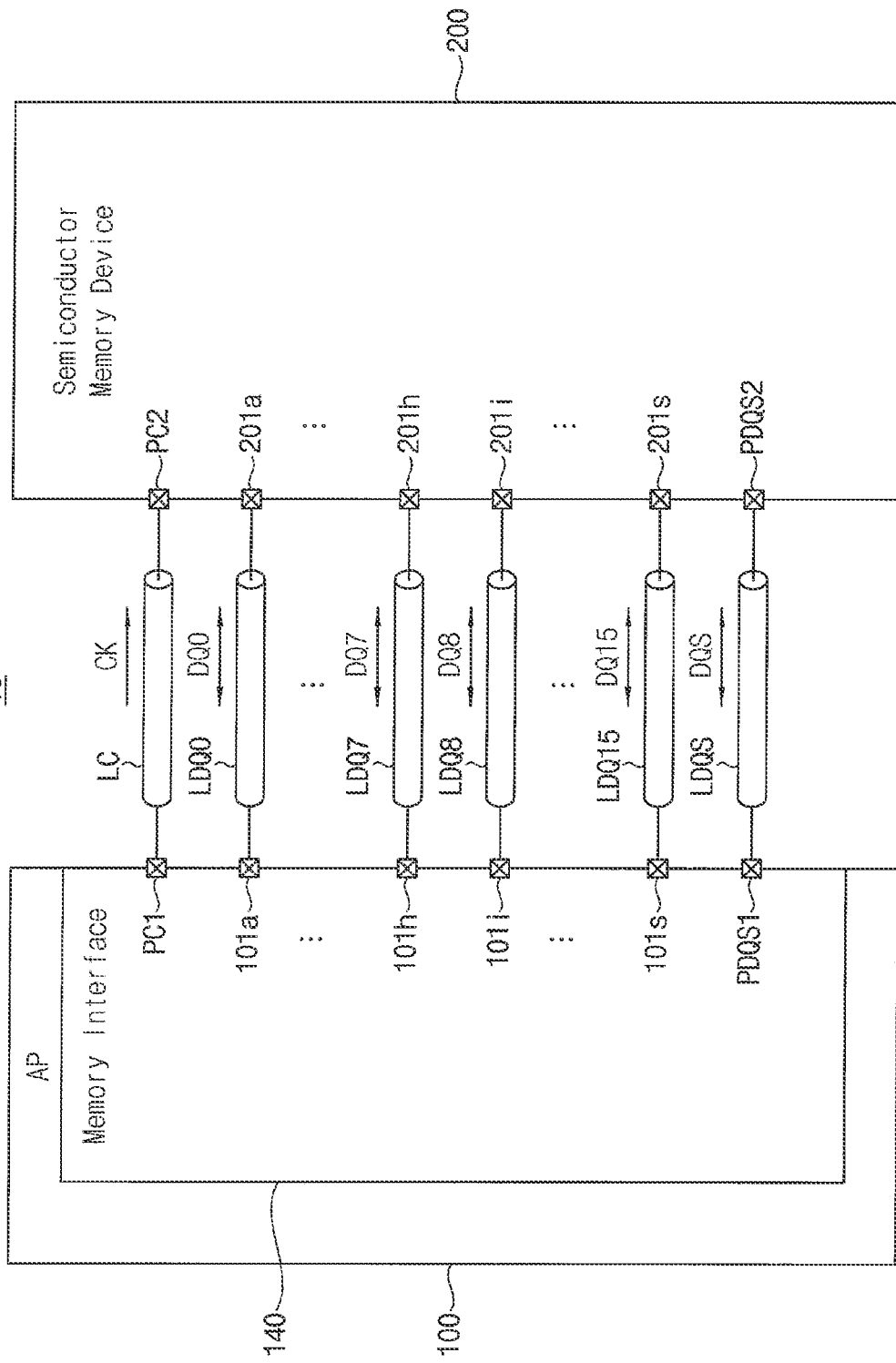
FIG. 7 illustrates the AP and the semiconductor memory device in the electronic device of FIG. 1.

FIG. 7 illustrates the AP and the semiconductor memory device in the electronic device of FIG. 1.

Referring to FIG. 7, the electronic device 10 may include the AP 100 and the semiconductor memory device 200. The memory interface 140 of the AP 100 may include a clock pad PC1, first data I/O pads 101a~101h, second data I/O pads 101*i*~101*s* and a data strobe pad PDQS1. The semiconductor memory device 200 may include a clock pad PC2, first data I/O pads 201*a*~201*h*, second data I/O pads 201*i*~201*s* and a data strobe pad PDQS2.

The memory interface 140 may transmit the clock CK to the semiconductor memory device 200 through a clock line LC connected between the clock pads PC1 and PC2.

The memory interface 140 may exchange each of first data signals DQ0~DQ7 with the semiconductor memory device 200 through a respective one of data lines LDQ0~LDQ7, which is connected between a respective one of the first data I/O pads 101*a*~101*h* and a respective one of the first data I/O pads 201*a*~201*h*, and exchange each of second data signals DQ8~DQ15 with the semiconductor memory device 200 through respective one of data lines LDQ8~LDQ15, which is connected between a respective one of the second data I/O pads 101*i*~101*s* and a respective one of the second data I/O pads 201*i*~201*s*. In addition, the memory interface 140 may exchange the data strobe signal DQS with the semiconductor memory device 200 through a data strobe line LDQS connected between the data strobe pads PDQS1 and PDQS2.

Figure 8:
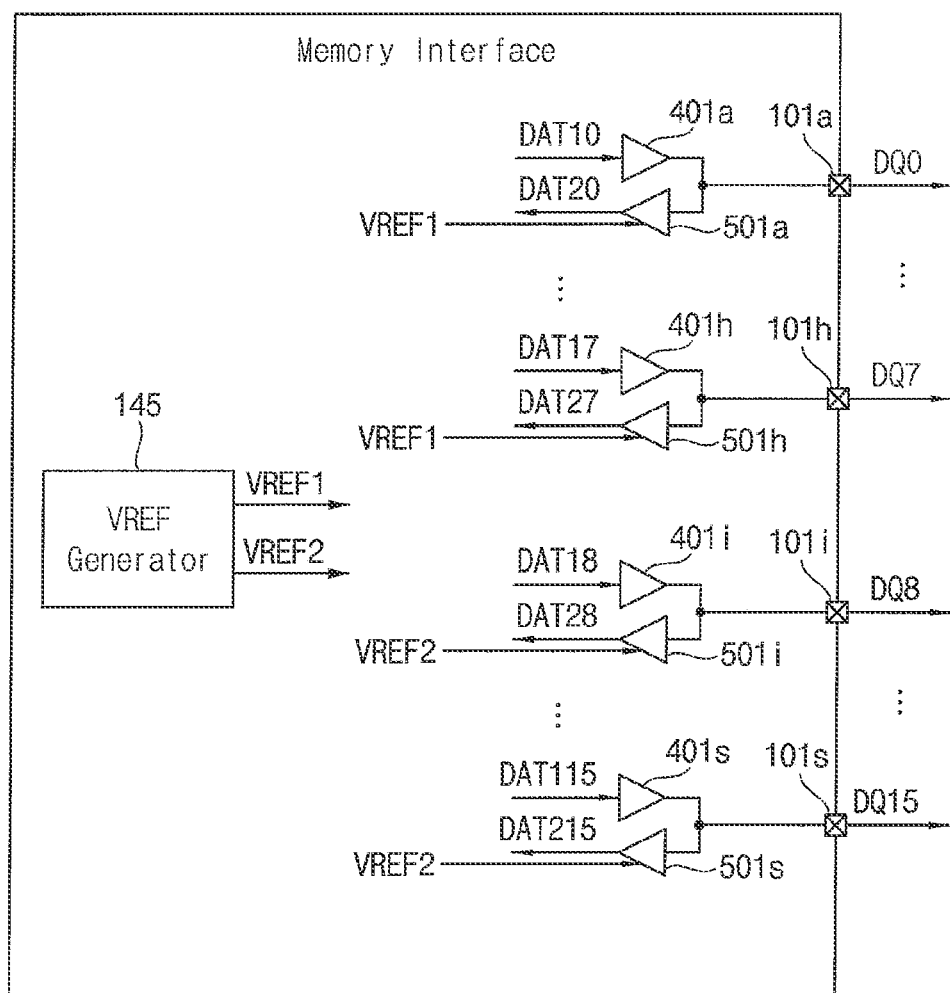
FIG. 8 is a block diagram illustrating an example of the memory interface in the electronic device of FIG. 7.

FIG. 8 is a block diagram illustrating an example of the memory interface in the electronic device of FIG. 7.

Referring to FIG. 8, the memory interface 140 may include a reference voltage generator 145, first transmitters 401*a*~401*h*, second transmitters 401*i*~401*s*, first receivers 501*a*~501*h* and second receivers 501*i*~501*s*.

Each of the first transmitters 401*a*~401*h* may be connected to respective one of the first data I/O pads 101*a*~101*h* and may transmit a respective one of first input data DAT10 through DAT17 as respective one of the first data signals DQ0~DQ7. Each of the first receivers 501*a*~501*h* may be connected to respective one of the first data I/O pads 101*a*~101*h* and may receive a respective one of the first data signals DQ0~DQ7 as respective one of first output data DTA20~DTA27. Each of the second transmitters 401*i*~401*s* may be connected to respective one of the second data I/O pads 101*i*~101*s* and may transmit a respective one of second input data DAT18 through DAT115 as respective one of the second data signals DQ8~DQ15. Each of the second receivers 501*i*~501*s* may be connected to respective one of the second data I/O pads 101*i*~101*s* and may receive a respective one of the second data signals DQ8~DQ15 as respective one of second output data DTA28~DTA215.

The reference voltage generator 145 may generate a first reference voltage VREF1 and a second reference voltage VREF2, may provide the first reference voltage VREF1 to the first receivers 501*a*~501*h* and may provide the second reference voltage VREF2 to the second receivers 501*i*~501*s*. Although not illustrated, the reference voltage generator 145 may provide the first reference voltage VREF1 and the second reference voltage VREF2 to the first transmitters 401*a*~401*h* and the second transmitters 401*i*~401*s*.

Each of the first receivers 501*a*~501*h* may adjust a duty of a respective one of the first data signals DQ0~DQ7 based on possible combinations of the reception control code set CCS1 (in FIG. 3) with respect to the first reference voltage VREF1 and may provide the training circuit 146 with the first data signals DQ0~DQ7 whose duties are adjusted in data duty training. The training circuit 146 may calculate eye opening values of the possible combinations of the reception control code set CCS1 and may store, in the on-chip memory 120, reception control codes associated with eye opening values of the first data signals DQ0~DQ7 whose duties are adjusted.

Each of the second receivers 501*i*~501*s* may adjust a duty of a respective one of the second data signals DQ1~DQ15 based on the possible combinations of the reception control code set CCS1 with respect to the second reference voltage VREF2 and may provide the training circuit 146 with the second data signals DQ8~DQ15 whose duties are adjusted in data duty training. The training circuit 146 may calculate eye opening values of the possible combinations of the reception control code set CCS1 and may store, in the on-chip memory 120, reception control codes associated with eye opening values of the second data signals DQ8~DQ15 whose duties are adjusted.

Each of the first transmitters 401*a*~401*h* may adjust a duty of a respective one of the first data signals DQ0~DQ7 based on possible combinations of the transmission control code set CCS2 (in FIG. 3) with respect to the first reference voltage VREF1 and may provide the training circuit 146 with the first data signals DQ0~DQ7 whose duties are adjusted. Each of the second transmitters 401*i*~401*s* may adjust a duty of a respective one of the second data signals DQ8~DQ15 based on the possible combinations of the transmission control code set CCS2 with respect to the second reference voltage VREF2 and may provide the training circuit 146 with the second data signals DQ8~DQ15 whose duties are adjusted.

Figure 9:
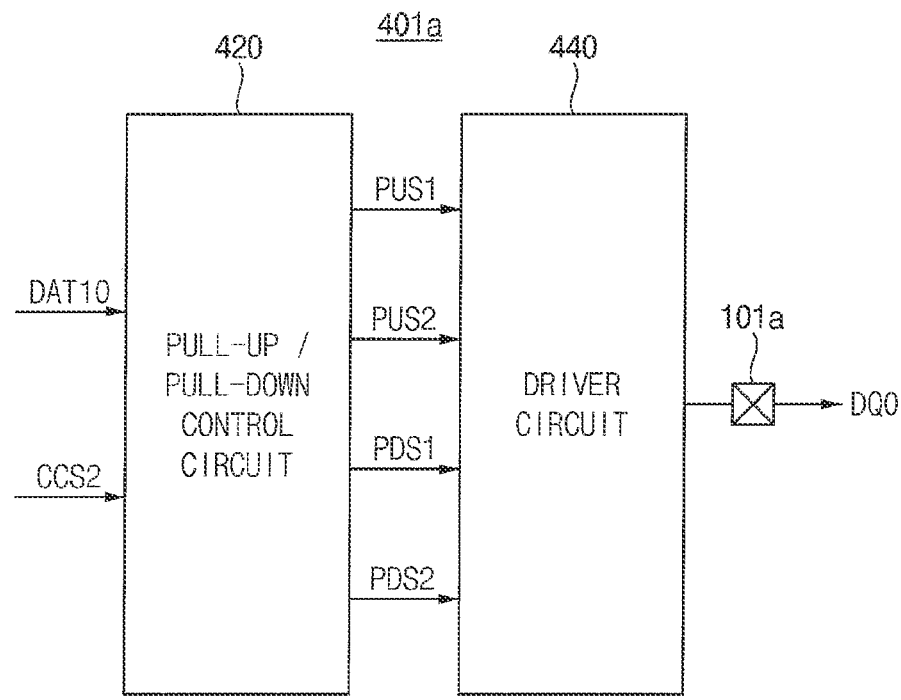
FIG. 9 is a block diagram illustrating one of the transmitters in the memory interface of FIG. 8 according to example embodiments.

FIG. 9 is a block diagram illustrating one of the transmitters in the memory interface of FIG. 8 according to example embodiments.

FIG. 9 illustrates a configuration of the transmitter 401*a* and other transmitters of the first transmitters 401*a*~401*h* and each of the second transmitters 401*i*~401*s* may have a same configuration as the configuration of the transmitter 401*a*.

Referring to FIG. 9, the transmitter 401*a* may include a pull-up/pull-down control circuit 420 and a driver circuit 440.

The pull-up/pull-down control circuit 420 may generate first and second pull-up control signals PUS1 and PUS2 and first and second pull-down control signals PDS1 and PDS2 based on data DAT10 and the transmission control code set CCS2. The driver circuit 440 is connected to the data I/O pad 101*a* and may generate the data signal DQ0 based on the first and second pull-up control signals PUS1 and PUS2 and the first and second pull-down control signals PDS1 and PDS2.

Figure 10:
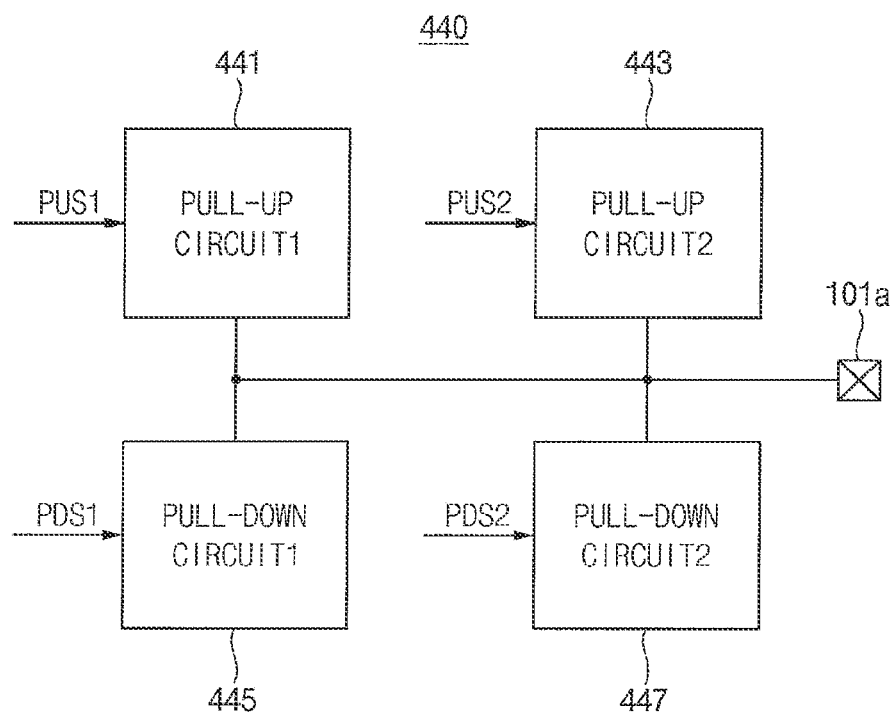
FIGS. 10 and 11 are diagrams illustrating examples of a driver circuit included in a transmitter of FIG. 9.
Figure 11:
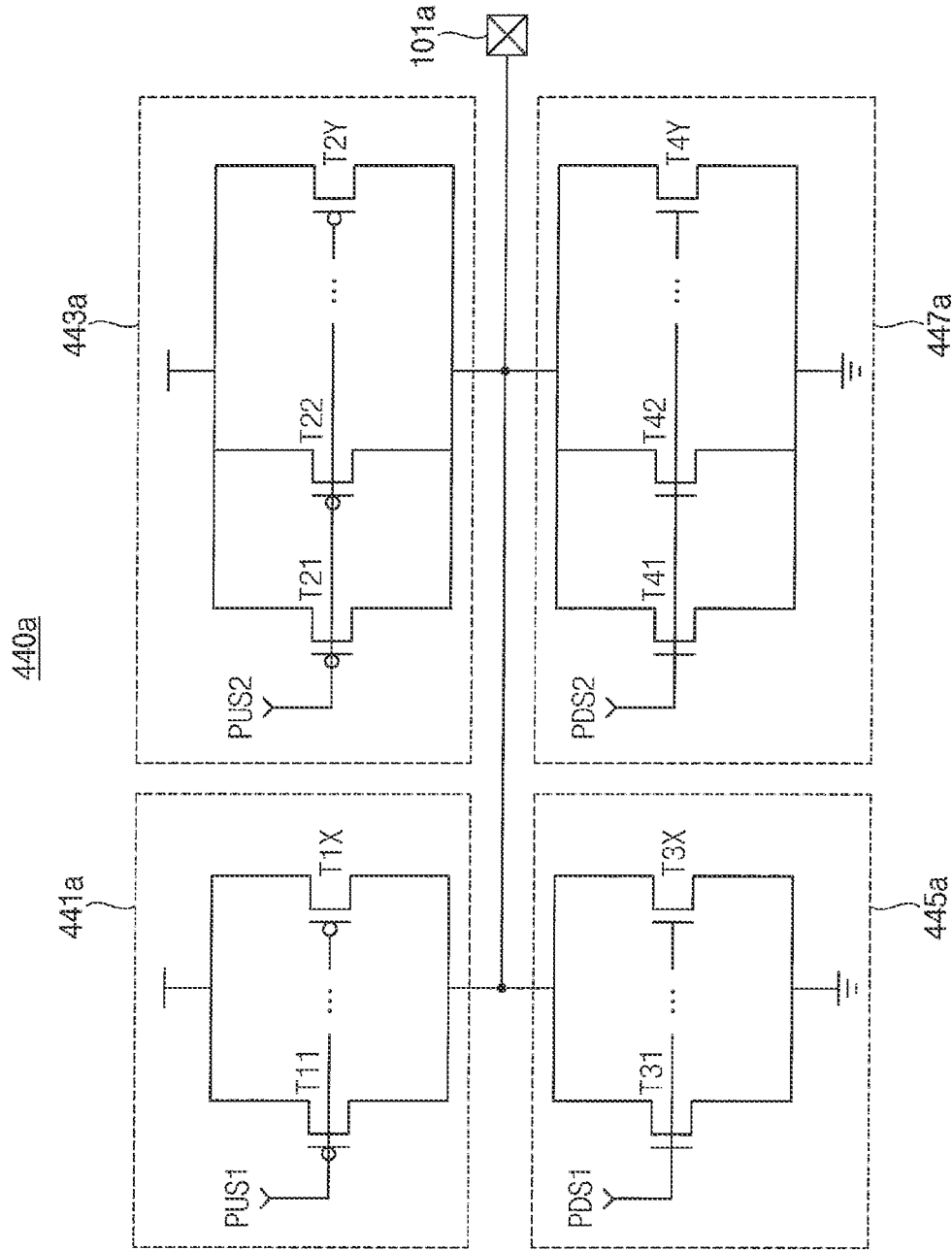

FIGS. 10 and 11 are diagrams illustrating examples of a driver circuit included in a transmitter of FIG. 9.

Referring to FIG. 10, the driver circuit 440 may include a first pull-up circuit 441, a second pull-up circuit 443, a first pull-down circuit 445 and a second pull-down circuit 447.

The first pull-up circuit 441 may pull up the data I/O pad 101*a* based on the first pull-up control signal PUS1. The second pull-up circuit 443 may pull up the data I/O pad 101*a* based on the second pull-up control signal PUS2. The first pull-down circuit 445 may pull down the data I/O pad 101*a* based on the first pull-down control signal PDS1. The second pull-down circuit 447 may pull down the data I/O pad 101*a* based on the second pull-down control signal PDS2.

Referring to FIG. 11, a driver circuit 440*a* may include a first pull-up circuit 441*a*, a second pull-up circuit 443*a*, a first pull-down circuit 445*a* and a second pull-down circuit 447*a*.

The first pull-up circuit 441*a* may include a plurality of first pull-up transistors T11, . . . , T1X that are connected in parallel between a power supply voltage and the data I/O pad 101a. The plurality of first pull-up transistors T11, . . . , T1X may be selectively turned on based on the first pull-up control signal PUS1.

The second pull-up circuit 443a may include a plurality of second pull-up transistors T21, T22, . . . , T2Y that are connected in parallel between the power supply voltage and the data I/O pad 101a. The plurality of second pull-up transistors T21, T22, . . . , T2Y may be selectively turned on based on the second pull-up control signal PUS2.

The first pull-down circuit 445a may include a plurality of first pull-down transistors T31, . . . , T3X that are connected in parallel between the data I/O pad 101a and a ground voltage. The plurality of first pull-down transistors T31, . . . , T3X may be selectively turned on based on the first pull-down control signal PDS1.

The second pull-down circuit 447a may include a plurality of second pull-down transistors T41, T42, . . . , T4Y that are connected in parallel between the data I/O pad 101a and the ground voltage. The plurality of second pull-down transistors T41, T42, . . . , T4Y may be selectively turned on based on the second pull-down control signal PDS2.

Figure 12:
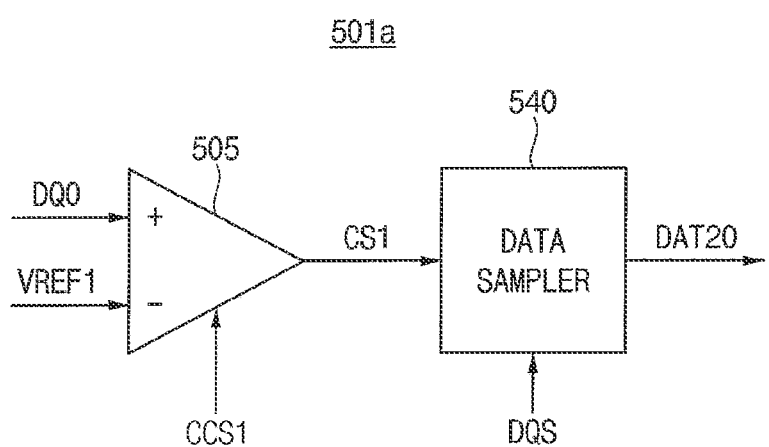
FIG. 12 is a block diagram illustrating one of the receivers in the memory interface of FIG. 8 according to example embodiments.

FIG. 12 is a block diagram illustrating one of the receivers in the memory interface of FIG. 8 according to example embodiments.

FIG. 12 illustrates a configuration of the receiver 501a and other receivers of the first receivers 501a~501h and each of the second receivers 501i~501s may have a same configuration as the configuration of the receiver 501a.

Referring to FIG. 12, the receiver 501a may include a comparator 505 and a data sampler 540.

The comparator 505 may compare the data signal DQ0 with the first reference voltage VREF1 to output a comparison signal CS1 indicating a result of the comparison of the data signal DQ0 and the first reference voltage VREF1 while adjusting a duty of the data signal DQ0 based on the reception control code set CCS1. The data sampler 540 may sample the comparison signal CS1 in response to the data strobe signal DQS to output target data bit (or output data) DAT20.

Figure 13:
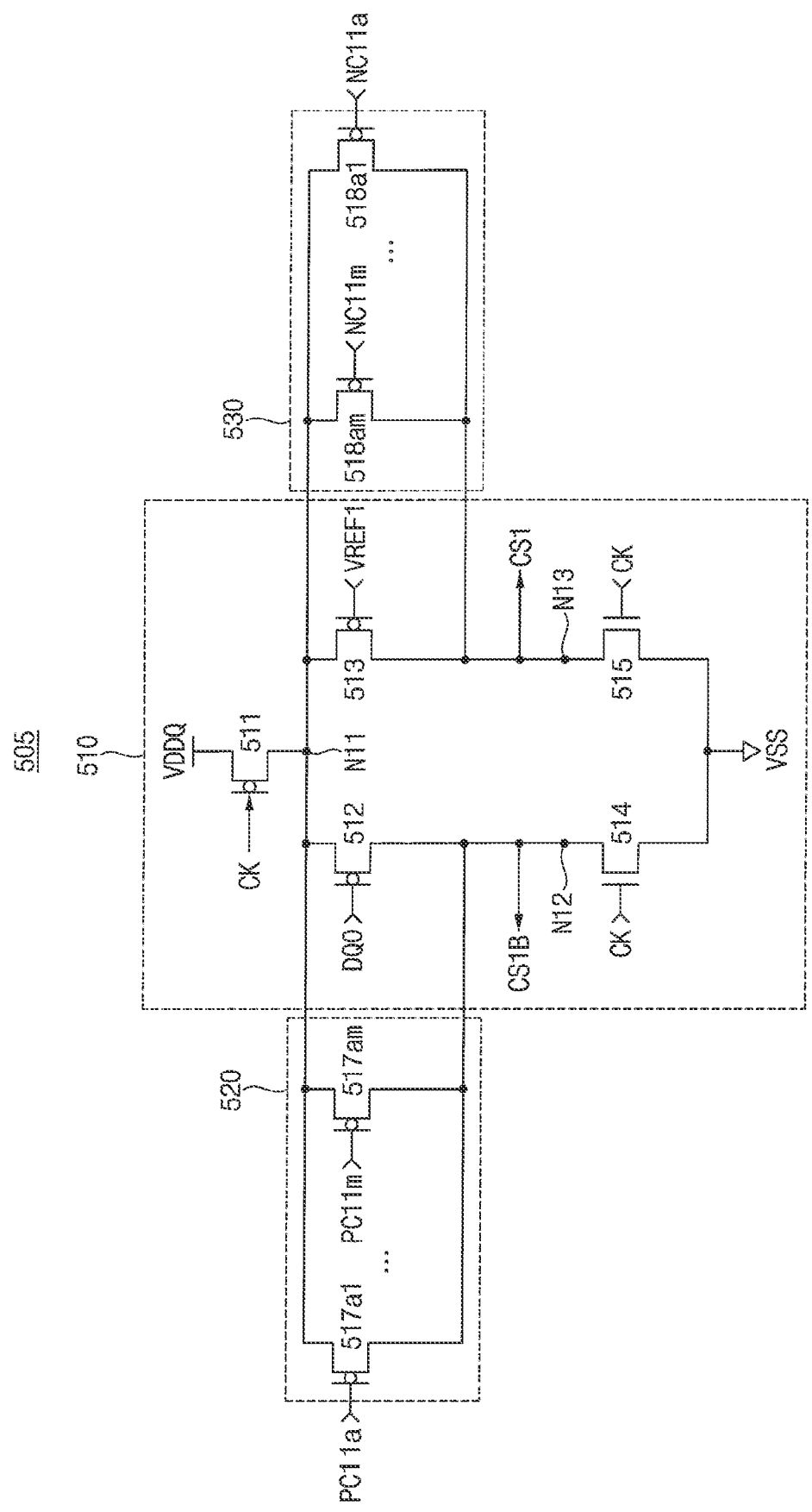
FIG. 13 is a circuit diagram illustrating an example of the comparator in the receiver of FIG. 12 according to example embodiments.

FIG. 13 is a circuit diagram illustrating an example of the comparator in the receiver of FIG. 12 according to example embodiments.

Referring to FIG. 13, the comparator 505 may include a sense amplifier 510, a first adjusting circuit 520 and a second adjusting circuit 530.

The sense amplifier 510 may include first through third p-channel metal-oxide semiconductor (PMOS) transistors 511, 512 and 513 and first and second n-channel metal-oxide semiconductor (NMOS) transistors 514 and 515.

The first PMOS transistor 511 is connected between a power supply voltage VDDQ and a first node N11 and has a gate receiving the clock signal CK. The second PMOS transistor 512 is connected between the first node N11 and a second node N12 and has a gate receiving the data signal DQ0. The third PMOS transistor 513 is connected between the first node N11 and a third node N13 and has a gate receiving the first reference voltage VREF1. The first NMOS transistor 514 is connected between the second node N12 and the ground voltage VSS and has a gate receiving the clock signal CK. The second NMOS transistor 515 is connected between the third node N13 and the ground voltage VSS and has a gate receiving the clock signal CK.

When the first PMOS transistor 511 is turned-on in response to the clock signal CK, the first NMOS transistor 514 and the second NMOS transistor 515 are turned-off. Therefore, currents corresponding to voltage difference between the data signal DQ0 and the first reference voltage VREF1 are provided to the second node N12 and the third node N13, respectively. When the first NMOS transistor 514 and the second NMOS transistor 515 are turned-on in response to the clock signal CK, the second node N12 and the third node N13 are discharged to the ground voltage VSS.

Therefore, the sense amplifier 510 may compare the data signal DQ0 and the first reference voltage VREF1, may output the comparison single CS1 at the third node N13 and may output an inverted comparison single CS1B at the second node N12.

The first adjusting circuit 520 may be connected between the first node N11 and the second node N12 in parallel with the second PMOS transistor 512. The first adjusting circuit 520 may include PMOS transistor pairs 517a1~517am connected in parallel with the second PMOS transistor 512 between the first node N11 and the second node N12. Each gate of the PMOS transistors 517a1~517am may receive a respective one of first control codes PC11a~PC11m. A number of the PMOS transistors 517a1~517am, which are turned on may be varied based on the first control codes PC11a~PC11m and thus, a first current provided to the second node N12 may be varied according to the first control codes PC11a~PC11m. Therefore, the first adjusting circuit 520 may adjust a duty of the data signal DQ0 by adjusting the first current provided to the second node N12 from the first node N11 based on the first control codes PC11a~PC11m.

The second adjusting circuit 530 may be connected between the first node N11 and the third node N13 in parallel with the third PMOS transistor 513. The second adjusting circuit 530 may include PMOS transistor 518a1~518am connected in parallel with the third PMOS transistor 513 between the first node N11 and the third node N13. Each gate of the PMOS transistors 518a1~518am may receive a respective one of second control codes NC11a~NC11m. The second adjusting circuit 530 may adjust a duty of the reference voltage VREF by adjusting a second current provided to the third node N13 from the first node N11 based on the second control codes NC11a~NC11m.

Figure 14A:
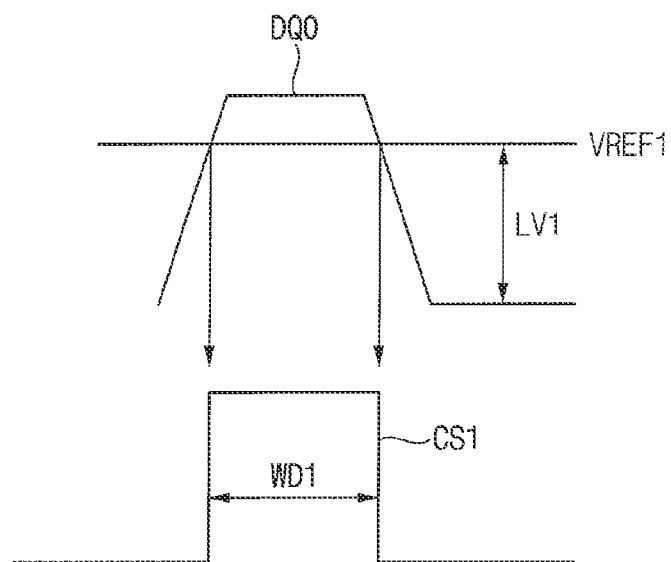
FIGS. 14A and 14B are diagrams for explaining a relationship between a level of the reference voltage and a duty of the data signal.
Figure 14B:
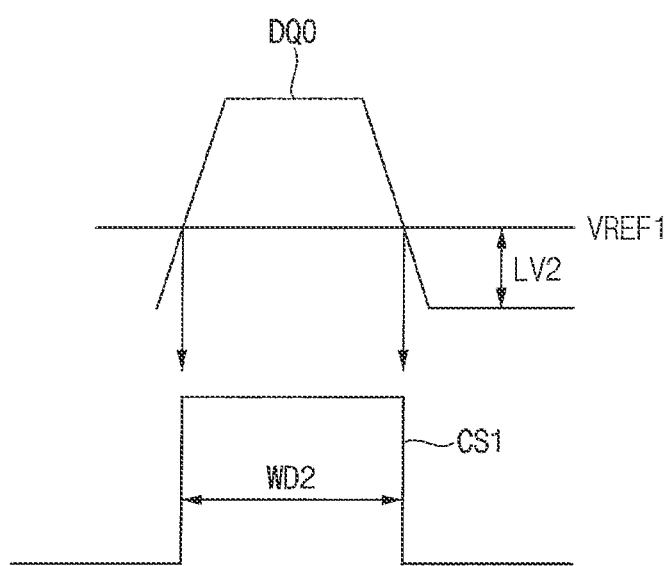

FIGS. 14A and 14B are diagrams for explaining a relationship between a level of the reference voltage and a duty of the data signal.

Referring to FIG. 14A, when the first reference voltage VREF1 has a first level LV1, the comparator 205 in FIG. 12 compares the data signal DQ0 with the first reference voltage VREF1 to output the comparison signal CS1 and the comparison signal CS1 has an interval of a high level corresponding to a first width WD1.

Referring to FIG. 14B, when the first reference voltage VREF1 has a second level LV2 smaller than the first level LV1, the comparator 205 in FIG. 12 compares the data signal DQ0 with the first reference voltage VREF1 to output the comparison signal CS1 and the comparison signal CS1 has an interval of a high level corresponding to a second width WD2 greater than the first width WD1.

When the level of the first reference voltage VREF1 is adjusted, the high level interval of the comparison signal CS1, i.e., an output of the comparator 505 varies. When the first reference voltage VREF1 is fixed, adjusting a duty of the data signal DQ0 has a same effect as adjusting the level of the first reference voltage VREF1.

Figure 15:
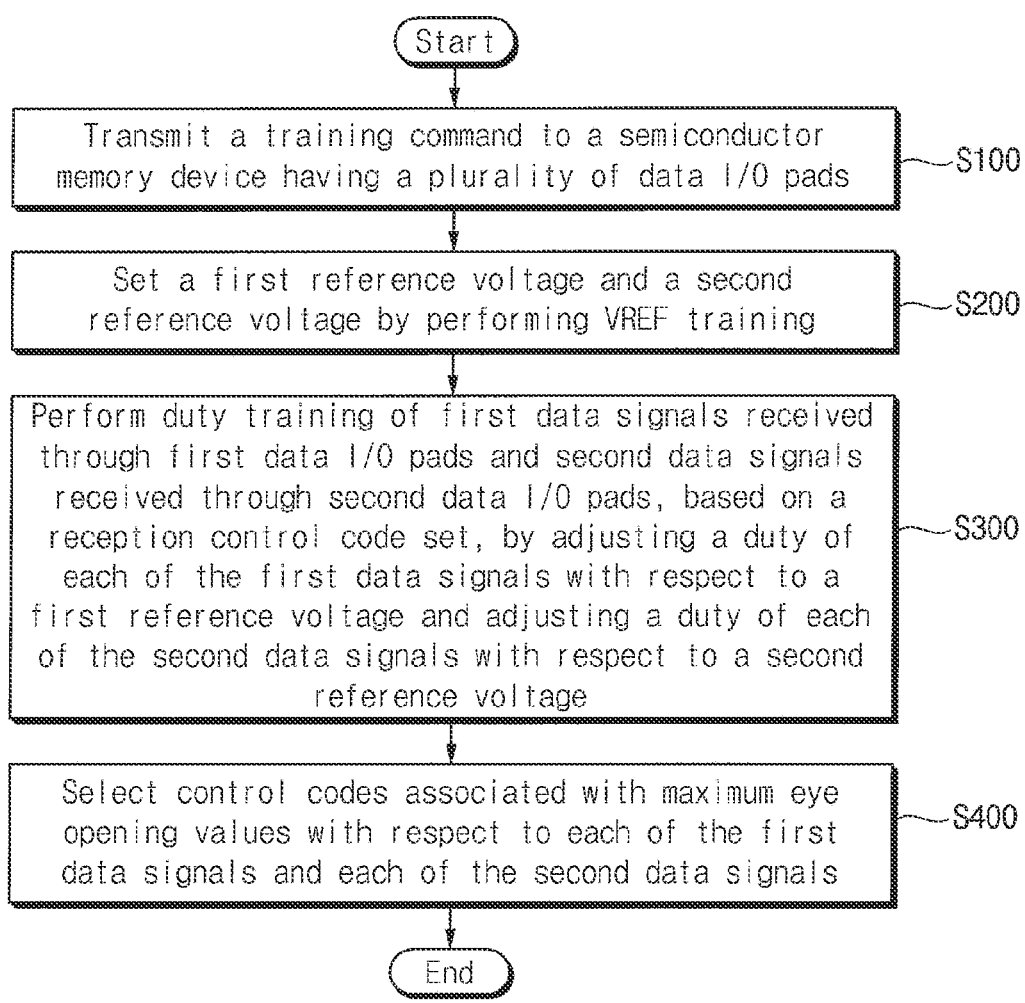
FIG. 15 is a flow chart illustrating a method of operating an AP according to example embodiments.

FIG. 15 is a flow chart illustrating a method of operating an AP according to example embodiments.

Referring to FIGS. 1 through 15, there is provided a method of operating the AP 100 including a memory controller 130 and a memory interface 140 connected to a semiconductor memory device 200 through first data I/O pads and second data I/O pads. According to the method, a training circuit 146 in the memory interface 140 transmits a training command to the semiconductor memory device 200 including first data I/O pads and second data I/O pads (operation S100).

The training circuit 146 sets a first reference voltage VREF1 and a second reference voltage VREF2 by performing a reference voltage training (operation S200).

The training circuit 146 performs duty training of first data signals DQ0~DQ7 in each of first receivers 501a~501h and second data signals DQ8~DQ15 in each of second receivers 501i~501s, based on a reception control code set CCS1, by adjusting a duty of each of the first data signals DQ0~DQ7 received through the first data I/O pads 101a~101h with respect to the first reference voltage VREF1 and adjusting a duty of each of the second data signals DQ8~DQ15 received through the second data I/O pads 101i~101s with respect to the second reference voltage VREF2 (operation S300).

The training circuit 146 may calculate eye opening values of the first data signals DQ0~DQ7 and the second data signals DQ8~DQ15 at each of an initial value through a final value of possible combinations of the reception control code set CCS1 by sweeping the possible combinations from an initial value to a final value and may store the calculated eye opening values in the on-chip memory 120.

The training circuit 146 may select a control code associated with a maximum eye opening value with respect to the first data signals DQ0~DQ7 and the second data signals DQ8~DQ15 by referring to the on-chip memory 120 (operation S400) and the memory controller 130 may use the selected control code in a normal read operation with the semiconductor memory device 200.

In addition, the training circuit 146 performs similar duty training of the first data signals DQ0~DQ7 in each of first transmitters 401a~401h and the second data signals DQ8~DQ15 in each of second transmitters 401i~401s, based on a transmission control code set CCS2 by adjusting a duty of each of the first data signals DQ0~DQ7 transmitted through the first data I/O pads 101a~101h with respect to the first reference voltage VREF1 and adjusting a duty of each of the second data signals DQ8~DQ15 transmitted through the second data I/O pads 101i~101s with respect to the second reference voltage VREF2.

The training circuit 146 may calculate eye opening values of the first data signals DQ0~DQ7 and the second data signals DQ8~DQ15 at each of an initial value through a final value of possible combinations of the transmission control code set CCS2 and may store the calculated eye opening values in the on-chip memory 120.

The training circuit 146 may select a control code associated with a maximum eye opening value with respect to the first data signals DQ0~DQ7 and the second data signals DQ8~DQ15 by referring to the on-chip memory 120, and the memory controller 130 may use the selected control code in a normal write operation with the semiconductor memory device 200.

The training circuit 146 may perform the duty training in an initialization operation after power is applied to the AP 100.

In response to the AP 100 being rebooted (in which the initialization operation is not performed for a first time) instead of the AP 100 being rebooted (in which the initialization operation is performed for the first time), the training circuit 146 may load training data that was previously obtained and stored in the on-chip memory 120 and may perform a data read operation and a data write operation on the semiconductor memory device 200 based on the loaded training data.

In response to the AP 100 being rebooted (in which the initialization operation is not performed for a first time) instead of the AP 100 being rebooted (in which the initialization operation is performed for the first time), the training circuit 146 may load training data that was previously obtained and stored in the on-chip memory 120, may perform the duty training in response to the loaded training data being abnormal, and may perform a data read operation and a data write operation on the semiconductor memory device 200 based on the control code set obtained by the duty training which is performed again.

Figure 16:
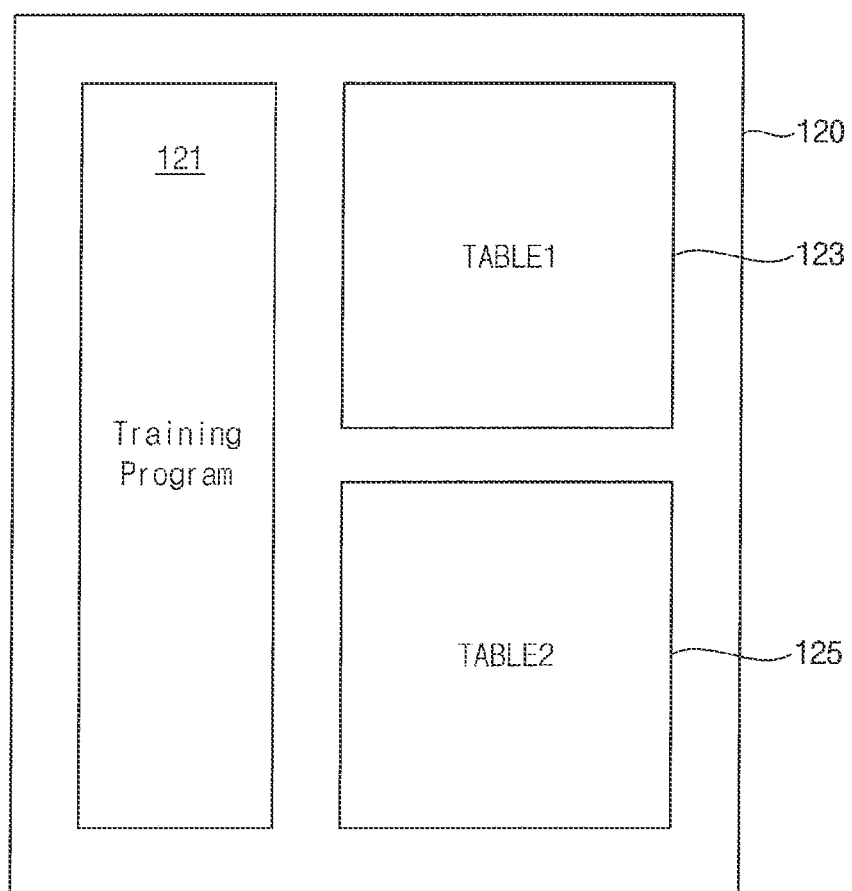
FIG. 16 is a block diagram illustrating an example of an on-chip memory in the AP of FIG. 3 according to example embodiments.

FIG. 16 is a block diagram illustrating an example of an on-chip memory in the AP of FIG. 3 according to example embodiments.

Referring to FIG. 16, the on-chip memory 120 may store the training program 121, a first table 123 and a second table 125.

The first table 123 may store the reception control code set obtained by the duty training associated with the first receivers 501a~501h and the second receivers 501i~501s and eye opening values of the first data signals DQ0~DQ7 and the second data signals DQ8~DQ15 whose duties are adjusted.

The second table 125 may store the transmission control code set obtained by the duty training associated with the first transmitters 401a~401h and the second transmitters 401i~401s and eye opening values of the first data signals DQ0~DQ7 and the second data signals DQ8~DQ15 whose duties are adjusted.

FIG. 17 illustrates an example of a first table in the on-chip memory of FIG. 16 according to example embodiments.

Referring to FIG. 17, the first table 123 may store eye opening values of the first data signals dq0~dq7, the second data signals dq8~dq15 whose duties are adjusted, and data mask signals dm0 and dm1 at each of first sub control codes p0~p3 and second sub control codes n0~n3 of possible combinations of the reception control code set CCS1.

The training circuit 146 may calculate (measure) eye opening values of the first data signals dq0~dq7, the second data signals dq8~dq15 whose duties are adjusted, and data mask signals dm0 and dm1 at each of first sub control codes p0~p3 and second sub control codes n0~n3 by sweeping possible combinations of the reception control code set CCS1 from the initial value p0 and n0 to the final value p3 and n3, and may store the calculated eye opening values in the first table 123.

The memory controller 130 may use a sub control code associated with a maximum eye opening value among the eye opening values of the first data signals dq0~dq7, the second data signals dq8~dq15 whose duties are adjusted, and data mask signals dm0 and dm1 in a normal read operation and in a normal write operation with the semiconductor memory device 200.

Although not illustrated, the second table 125 may have a similar configuration with a configuration of the first table 123. The second table 125 may store eye opening values of the first data signals dq0~dq7, the second data signals dq8~dq15 whose duties are adjusted, and the data mask signals dm0 and dm1 at each of first sub control codes and second sub control code of possible combinations of the transmission control code set CCS2.

The training circuit 146 may calculate (measure) eye opening values of the first data signals dq0~dq7, the second data signals dq8~dq15 whose duties are adjusted, and the data mask signals dm0 and dm1 at each of first sub control codes and the second sub control codes by sweeping possible combinations of the transmission control code set CCS2 from the initial value to the final value, and may store the calculated eye opening values in the second table 125.

Figure 18:
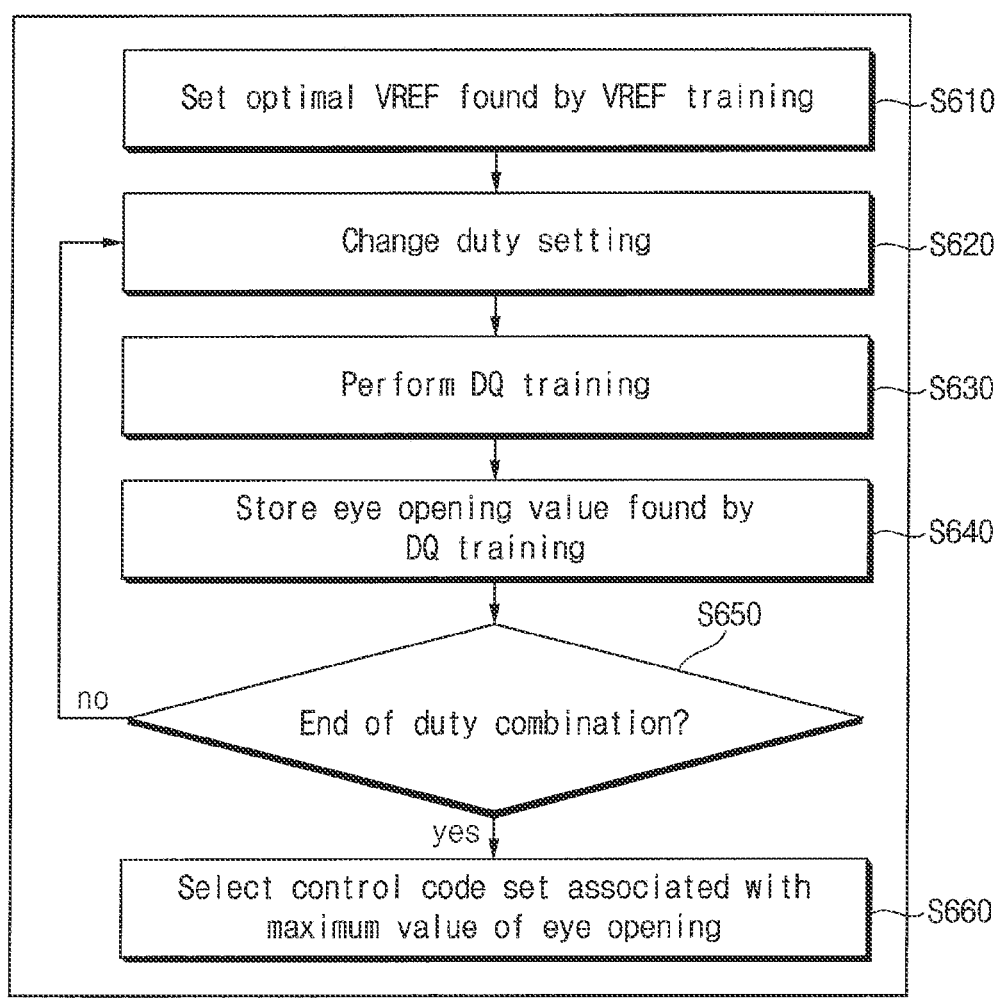
FIG. 18 flow chart illustrating a method of performing data duty training in an AP according to example embodiments.

FIG. 18 is a flow chart illustrating a method of performing data duty training in an AP according to example embodiments.

Referring to FIGS. 1 through 18, the training circuit 146 sets a first reference voltage VREF1 and a second reference voltage VREF2 having optimal levels by performing a reference voltage training (operation S610). The training circuit 146 changes a control code set associated with a duty setting (operation S620).

The training circuit 146 performs data training on the first data signals and the second data signals based on the changed control code set (operation S630). The training circuit 146 stores (or saves), in the on-chip memory 120, eye opening values associated with current control code set (operation S640).

The training circuit 146 determines whether the current control code set corresponds to an end of the duty combination (operation S650). When the current control code set does not correspond to the end of the duty combination (NO in S650), the training circuit 146 changes a control code set associated with the duty setting (operation S620). When the current control code corresponds to the end of the duty combination (YES in S650), the training circuit 146 selects the control code set associated with a maximum eye opening value among the eye opening values stored in the on-chip memory 120 (operation S660) and uses the selected control code set in a normal operation with the semiconductor memory device 200.

Figure 19:
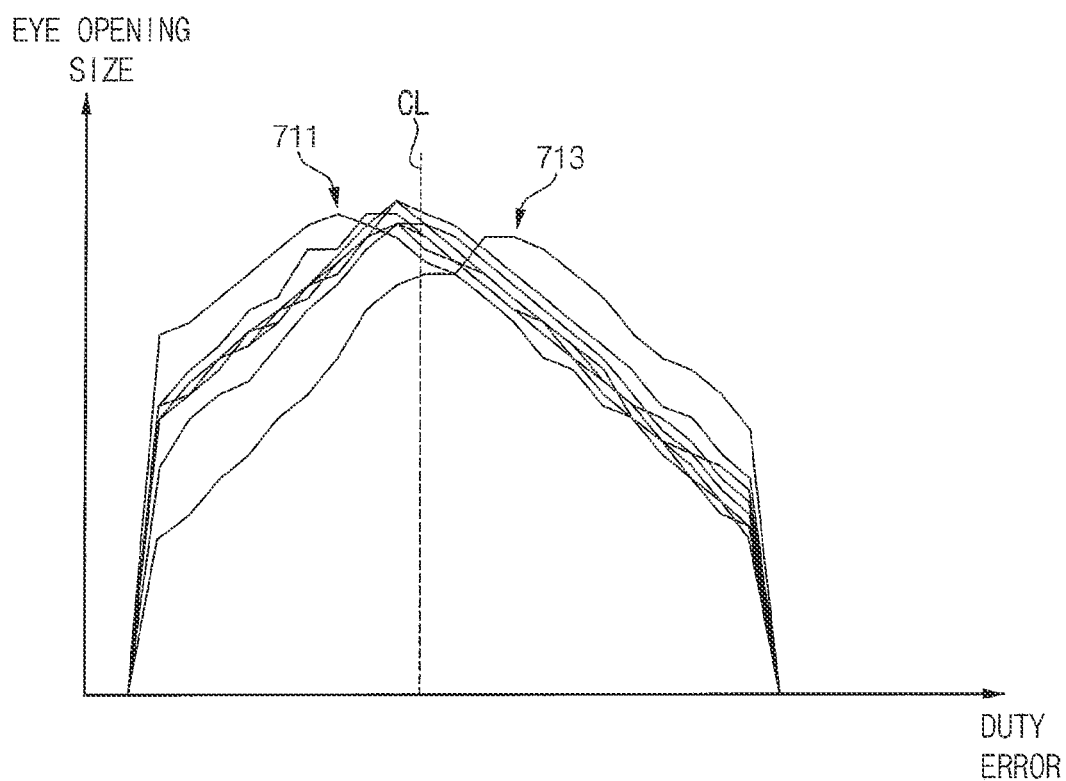
FIG. 19 is a graph illustrating eye opening values of data signals whose duties are not adjusted.

FIG. 19 is a graph illustrating eye opening values of data signals whose duties are not adjusted.

Referring to FIG. 19, when a duty of each of the first data signals DQ0~DQ7 is not adjusted and a level of the first reference voltage VREF1 is fixed because eye opening values at each of the first data signals DQ0~DQ7 are not overlapped, it is noted that margin is degraded with respect to a center line CL as reference numerals 711 and 713 indicate.

In FIG. 19, the X axis denotes duty error of the first data signals DQ0~DQ7, the Y axis denotes eye opening size (or, eye opening values) of the first data signals DQ0~DQ7 according to a given duty error when the level of the first reference voltage REF1 is fixed and the center line CL denotes a point at which the duty error is zero.

Figure 20:
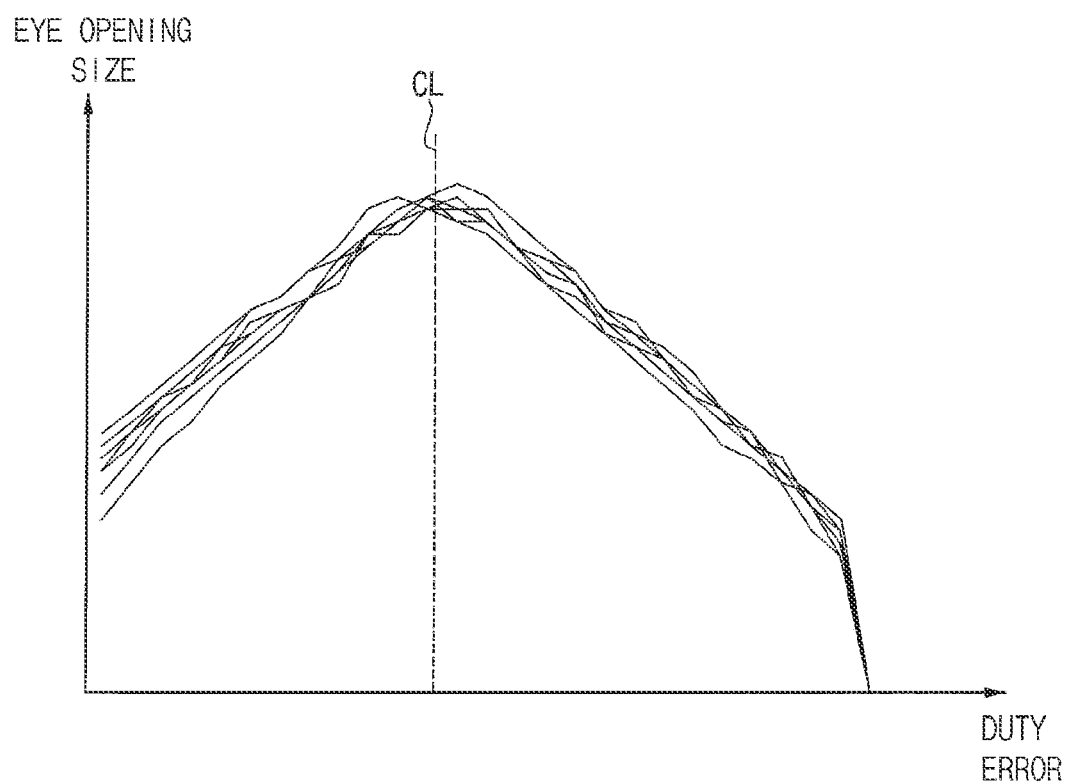
FIG. 20 is a graph illustrating eye opening values of data signals whose duties are adjusted according to example embodiments.

FIG. 20 is a graph illustrating eye opening values of data signals whose duties are adjusted according to example embodiments.

Referring to FIG. 20, when a duty of each of the first data signals DQ0~DQ7 is adjusted and although a level of the first reference voltage VREF1 is fixed, eye opening sizes of each of the first data signals DQ0~DQ7 has maximum values around a center line CL.

In FIG. 20, the X axis denotes duty error of the first data signals DQ0~DQ7, the Y axis denotes eye opening size (or, eye opening value) of the first data signals DQ0~DQ7 according to a given duty error and the center line CL denotes a point at which the duty error is zero when the reception control code set CCS1 is set to optimal values.

Figure 21:
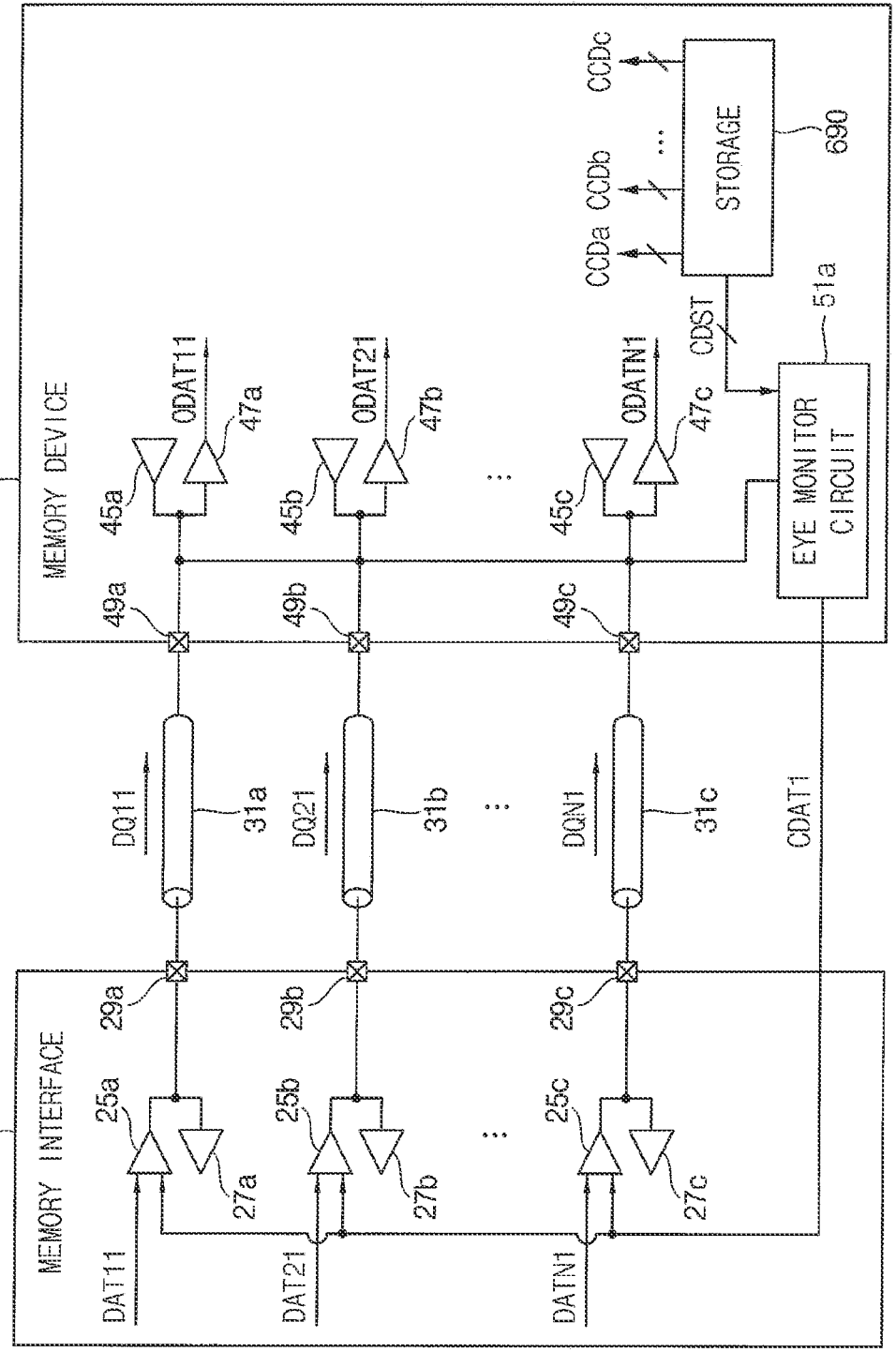
FIG. 21 is a block diagram illustrating an example of an electronic device of FIG. 1 according to example embodiments.

FIG. 21 is a block diagram illustrating an example of an electronic device of FIG. 1 according to example embodiments. The descriptions repeated with respect to FIG. 6 will be omitted.

Referring to FIG. 21, an electronic device 12 may include a memory interface 140b, a semiconductor memory device 200b and a plurality of channels 31a, 31b and 31c.

The electronic device 12 may be substantially the same as the electronic device 11 of FIG. 6, except that the semiconductor memory device 200b further includes an eye monitor circuit 51a and a storage 690.

The eye monitor circuit 51a may be connected to the plurality of channels 31a, 31b and 31c and may generate characteristic data CDAT1 that represents characteristics of the channels 31a, 31b and 31c based on the received data signals DQ11, DQ21 and DQN1 and a control code set CDST stored in the storage 690. The control code set CDST stored in the storage 690 through the training may be provided to the receivers 47a, 47b and 47c as control codes CCDa, CCDb, . . . , CCDc.

A pull-up/pull-down control circuit (e.g., the pull-up/pull-down control circuit 420 in FIG. 9) included in each of the transmitters 25a, 25b and 25c may generate pull-up control signals and pull-down control signals based on the characteristic data CDAT1. Data duty training may be performed based on the characteristics of the channels 31a, 31b and 31c.

The eye monitor circuit 51a may be included with respect to each of the channels 31a, 31b and 31c or may be disposed outside of the memory interface 140b and the semiconductor memory device 200b.

A level of a reference voltage of each of the receivers 47a, 47b and 47c in the semiconductor memory device 200b may be individually set.

Figure 22:
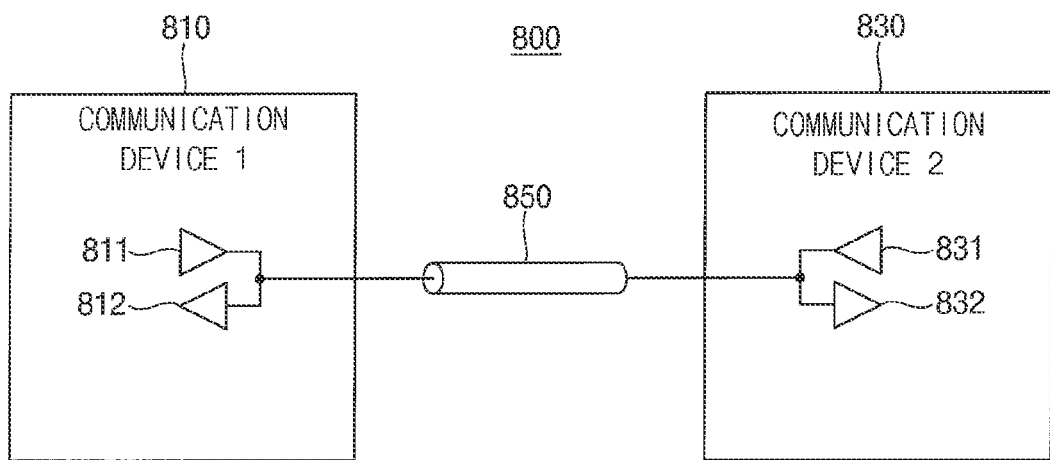
FIG. 22 is a block diagram illustrating a communication system according to example embodiments.

FIG. 22 is a block diagram illustrating a communication system according to example embodiments.

Referring to FIG. 22, a communication system 800 includes a first communication device 810, a second communication device 830 and a channel 850.

The first communication device 810 includes a first transmitter 811 and a first receiver 812. The second communication device 830 includes a second transmitter 831 and a second receiver 832. The first transmitter 811 and the first receiver 812 are connected to the second transmitter 831 and the second receiver 832 through the channel 850. In some example embodiments, each of the first and second communication devices 810 and 830 may include a plurality of transmitters and a plurality of receivers and the communication system 800 may include a plurality of channels for connecting the plurality of transmitters and a plurality of receivers.

The receivers 812 and 832 may be the receiver according to example embodiments, may adjust a duty of each of data signals at each of possible combinations of a control code set in a training sequence in which a level of a reference voltage is not capable of being set per each of the data signals, may calculate eye opening values of the data signals whose duties are adjusted, and may use a control code set associated with a maximum eye opening value in a normal operation. Therefore, the receivers 812 and 832 may have an effect which is the same as a case when a level of the reference voltage is adjusted.

Figure 23:
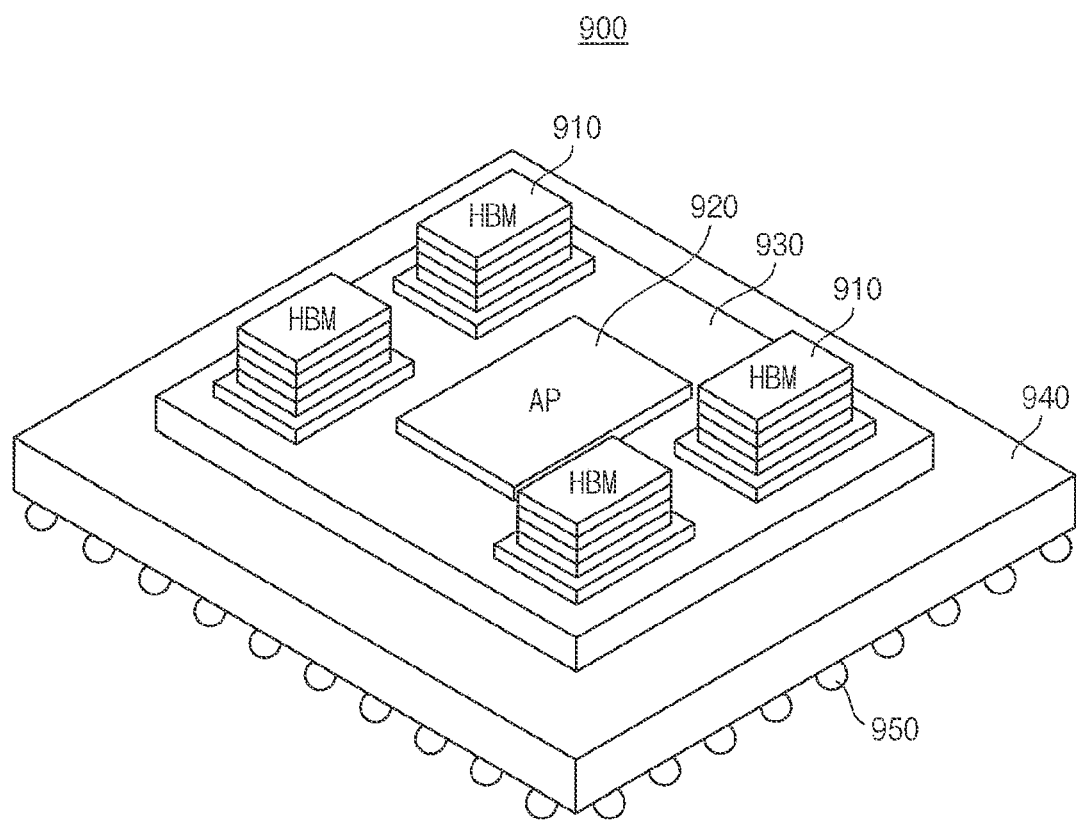
FIG. 23 is a configuration diagram illustrating a semiconductor package including an AP and a stacked memory device according to example embodiments.

FIG. 23 is a configuration diagram illustrating a semiconductor package including an AP and a stacked memory device according to example embodiments.

Referring to FIG. 23, a semiconductor package 900 may include one or more stacked memory devices 910 and an AP 920.

The stacked memory devices 910 and the AP 920 may be mounted on an interposer 930, and the interposer, on which the stacked memory device 910 and the AP 920 are mounted, may be mounted on a package substrate 940 mounted on solder balls 950.

The AP 920 may correspond to the AP 100 in FIG. 1 and may include a memory interface and a memory controller.

The stacked memory device 910 may be connected to the AP 920 through first data I/O pads and second data I/O pads. First data signals provided through the first data I/O pads may use a first reference voltage, and second data signals provided through the second data I/O pads may use a second reference voltage.

The stacked memory device 910 may be implemented in various forms, and the stacked memory device 910 may be a memory device in a high bandwidth memory (HBM) form, in which a plurality of layers are stacked. Accordingly, the stacked memory device 910 may include a buffer die and a plurality of memory dies. The plurality of memory dies may be stacked on the buffer die and may communicate data through a plurality of through silicon via lines.

The plurality of stacked memory devices 910 may be mounted on the interposer 930, and the AP 920 may communicate with the plurality of stacked memory devices 910.

For example, each of the stacked memory devices 910 and the AP 920 may include a physical region and communication may be performed between the stacked memory devices 910 and the AP 920 through the physical regions. When the stacked memory device 910 includes a direct access region, a test signal may be provided into the stacked memory device 910 through conductive means (e.g., solder balls 950) mounted under package substrate 940 and the direct access region.

The present disclosure may be applied to systems including a semiconductor memory device and an AP. For example, the present disclosure may be applied to systems such as a personal computer (PC), a server computer, a data center, a workstation, a mobile phone, a smart phone, a tablet computer, a laptop computer, a personal digital assistant (PDA), a portable multimedia player (PMP), a digital camera, a portable game console, a music player, a camcorder, a video player, a navigation device, a wearable device, an internet of things (IoT) device, an internet of everything (IoE) device, an e-book reader, a virtual reality (VR) device, an augmented reality (AR) device, a robotic device, a drone, etc.

As is traditional in the field, embodiments may be described and illustrated in terms of blocks which carry out a described function or functions. These blocks, which may be referred to herein as units or modules or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the disclosure. Likewise, the blocks of the embodiments may be physically combined into more complex blocks without departing from the scope of the disclosure. An aspect of an embodiment may be achieved through instructions stored within a non-transitory storage medium and executed by a processor.

While the present disclosure has been particularly shown and described with reference to the example embodiments thereof, it will be understood by those of ordinary skill in the art that various changes in form and detail may be made therein without departing from the spirit and scope of the present disclosure as defined by the following claims.

What is claimed is:

1. An application processor comprising:
   a memory interface connected to a semiconductor memory device through first data input/output (I/O) pads and second data I/O pads; and
   a memory controller configured to exchange data with the semiconductor memory device by controlling the memory interface, wherein:
   the memory interface includes a training circuit configured to perform duty training of first data signals and second data signals which are based on the data, based on a reception control code set, by:
      adjusting a duty of each of the first data signals with respect to a first reference voltage, the first data signals received through the first data I/O pads; and
      adjusting a duty of each of the second data signals with respect to a second reference voltage, the second data signals received through the second data I/O pads.

2. The application processor of claim 1, wherein the memory interface includes:
   a data reception circuit connected to the first data I/O pads and the second data I/O pads, the data reception circuit including:
      first receivers, each configured to receive a respective one of the first data signals from the semiconductor memory device; and
      second receivers, each configured to receive a respective one of the second data signals from the semiconductor memory device; and
   a data transmission circuit connected to the first data I/O pads and the second data I/O pads, the data transmission circuit including:
      first transmitters, each configured to transmit a respective one of the first data signals to the semiconductor memory device; and
      second transmitters, each configured to transmit a respective one of the second data signals to the semiconductor memory device.

3. The application processor of claim 2, wherein each of the first receivers includes:
   a comparator configured to compare a respective one of the first data signals with the first reference voltage to output a comparison signal and configured to adjust the duty of the respective one of the first data signals in response to the reception control code set; and
   a data sampler configured to sample the comparison signal based on a data strobe signal to output a target data bit.

4. The application processor of claim 3, wherein the comparator includes:
   a sense amplifier configured to compare the respective one of the first data signals with the first reference voltage to output a comparison signal;
   a first adjusting circuit, connected between in parallel with a first transistor to receive the respective one of the first data signals between a first node and a second node, the first adjusting circuit configured to control a first current provided to the second node in response to a first sub control code of the reception control code set; and a second adjusting circuit, connected between in parallel with a first transistor to receive the first reference voltage between the first node and a third node, the second adjusting circuit configured to control a second current provided to the third node in response to a second sub control code of the reception control code set.

5. The application processor of claim 2, further comprising:
an on-chip memory connected to the memory interface, wherein:
the training circuit is configured to:
calculate eye opening values of the first data signals and the second data signals at each of an initial value through a final value of possible combinations of the reception control code set by sweeping the possible combinations from the initial value to the final value; and
store the eye opening values in the on-chip memory with a table form.

6. The application processor of claim 5, wherein the memory controller is configured to use a control code associated with an eye opening value having a maximum value among the eye opening values in a normal read operation with the semiconductor memory device.

7. The application processor of claim 2, wherein the training circuit is configured to adjust duty of the first data signals and the second data signals when the data transmission circuit transmits the first data signals and the second data signals based on a transmission control code set.

8. The application processor of claim 7, wherein each of the first transmitters includes:
a pull-up/pull-down control circuit configured to generate first and second pull-up control signals and first and second pull-down control signals based on a target data bit and the transmission control code set; and
a driver circuit configured to drive the target data bit based on the first and second pull-up control signals and the first and second pull-down control signals to output the respective one of the first data signals.

9. The application processor of claim 7, further comprising:
an on-chip memory connected to the memory interface, wherein:
the training circuit is configured to:
calculate eye opening values of the first data signals and the second data signals at each of an initial value through a final value of possible combinations of the transmission control code set by sweeping the possible combinations from the initial value to the final value; and
store the eye opening values in the on-chip memory with a table form, and
the memory controller is configured to use a control code associated with an eye opening value having a maximum value among the eye opening values in a normal write operation with the semiconductor memory device.

10. The application processor of claim 1, wherein the training circuit is configured to perform the duty training in an initialization operation after power is applied to the application processor.

11. The application processor of claim 10, wherein:
in response to the application processor being rebooted after the initialization operation is performed for a first time, the training circuit is configured to:
load training data that was previously obtained and stored in an on-chip memory in the application processor; and
perform data read operation and data write operation on the semiconductor memory device based on the loaded training data.

12. The application processor of claim 10, wherein:
in response to the application processor being rebooted after the initialization operation is performed for a first time, the training circuit is configured to:
load training data that was previously obtained and stored in an on-chip memory in the application processor; and
perform the duty training in response to the loaded training data being abnormal.

13. An electronic device comprising:
a semiconductor memory device configured to store data; and
an application processor configured to control the semiconductor memory device, wherein:
the application processor includes:
a memory interface connected to the semiconductor memory device through first data input/output (I/O) pads and second data I/O pads; and
a memory controller configured to exchange the data with the semiconductor memory device by controlling the memory interface,
the memory interface includes a training circuit configured to perform duty training of first data signals and second data signals which are based on the data, based on a reception control code set, by:
adjusting a duty of each of the first data signals with respect to a first reference voltage, the first data signals received through the first data I/O pads; and
adjusting a duty of each of the second data signals with respect to a second reference voltage, the second data signals received through the second data I/O pads.

14. The electronic device of claim 13, wherein:
in a training sequence of the electronic device, the training circuit is configured to:
set the first reference voltage associated with the first data signals and the second reference voltage associated with the second data signals by performing a reference voltage training;
perform the duty training on the first data signals at the first reference voltage, which is fixed; and
perform the duty training on the second data signals at the second reference voltage, which is fixed.

15. The electronic device of claim 13, wherein the memory interface includes:
a data reception circuit connected to the first data I/O pads and the second data I/O pads, the data reception circuit including:
first receivers, each configured to receive a respective one of the first data signals from the semiconductor memory device; and
second receivers, each configured to receive a respective one of the second data signals from the semiconductor memory device; and
a data transmission circuit connected to the first data I/O pads and the second data I/O pads, the data transmission circuit including:

first transmitters, each configured to transmit a respective one of the first data signals to the semiconductor memory device; and second transmitters, each configured to transmit a respective one of the second data signals to the semiconductor memory device.

16. The electronic device of claim 15, wherein:

each of the first receivers includes:

a comparator configured to compare a respective one of the first data signals with the first reference voltage to output a comparison signal and configured to adjust the duty of the respective one of the first data signals in response to the reception control code set; and a data sampler configured to sample the comparison signal based on a data strobe signal to output a target data bit.

17. The electronic device of claim 15, wherein:

the application processor further includes an on-chip memory connected to the training circuit, the training circuit is configured to:

calculate eye opening values of an initial value through a final value of possible combinations of the reception control code set by sweeping the possible combinations from the initial value to the final value; and store the eye opening values in the on-chip memory with a table form, and the memory controller is configured to use a control code associated with an eye opening value having a maximum value among the eye opening values in a normal read operation with the semiconductor memory device.

18. The electronic device of claim 15, wherein:

the application processor further includes an on-chip memory connected to the training circuit, the training circuit is configured to:

generate eye opening values of an initial value through a final value of possible combinations of a transmission control code set by sweeping the possible combinations from the initial value to the final value; and store the eye opening values in the on-chip memory with a table form, and the memory controller is configured to use a control code associated with an eye opening value having a maximum value among the eye opening values in a normal write operation with the semiconductor memory device.

19. The electronic device of claim 13, wherein the semiconductor memory device includes a dynamic random access memory (DRAM) device including a plurality of volatile memory cells coupled to a plurality of word-lines and a plurality of bit-lines.

20. An application processor comprising:

a memory interface connected to a semiconductor memory device through first data input/output (I/O) pads and second data I/O pads;

a memory controller configured to exchange data with the semiconductor memory device by controlling the memory interface; and an on-chip memory connected to the memory interface, wherein:

the memory interface includes a training circuit configured to perform duty training of first data signals and second data signals, based on a reception control code set, by:

adjusting a duty of each of the first data signals with respect to a first reference voltage, the first data signals received through the first data I/O pads; and adjusting a duty of each of the second data signals with respect to a second reference voltage, the second data signals received through the second data I/O pads, the memory interface includes:

a data reception circuit connected to the first data I/O pads and the second data I/O pads, the data reception circuit including:

first receivers, each configured to receive a respective one of the first data signals from the semiconductor memory device; and second receivers, each configured to receive a respective one of the second data signals from the semiconductor memory device; and a data transmission circuit connected to the first data I/O pads and the second data I/O pads, the data transmission circuit including:

first transmitters, each configured to transmit a respective one of the first data signals to the semiconductor memory device; and second transmitters, each configured to transmit a respective one of the second data signals to the semiconductor memory device, and the training circuit is configured to:

calculate eye opening values of an initial value through a final value of possible combinations of the reception control code set by sweeping the possible combinations from the initial value to the final value; and store the eye opening values in the on-chip memory with a table form.

* * * * *